(12) United States Patent
Mathur

(10) Patent No.: US 10,348,276 B2
(45) Date of Patent: Jul. 9, 2019

(54) LOOP DELAY OPTIMIZATION FOR MULTI-VOLTAGE SELF-SYNCHRONOUS SYSTEMS

(71) Applicant: SanDisk Technologies LLC, Plano, TX (US)

(72) Inventor: Shiv Harit Mathur, Bangalore (IN)

(73) Assignee: SanDisk Technologies LLC, Addison, TX (US)

( * ) Notice: Subject to any disclaimer, the term of this patent is extended or adjusted under 35 U.S.C. 154(b) by 1 day.

(21) Appl. No.: 15/858,070

(22) Filed: Dec. 29, 2017

(65) Prior Publication Data

US 2018/0123570 A1 May 3, 2018

Related U.S. Application Data

(63) Continuation of application No. 14/927,694, filed on Oct. 30, 2015, now Pat. No. 9,859,874.

(51) Int. Cl.
*H03K 5/00* (2006.01)
*H03K 5/13* (2014.01)
*G06F 13/38* (2006.01)
*H03K 3/353* (2006.01)

(52) U.S. Cl.
CPC ........... *H03K 3/353* (2013.01); *G06F 13/385* (2013.01); *H03K 5/13* (2013.01); *H03K 2005/00019* (2013.01)

(58) Field of Classification Search
CPC ..... H04L 7/0008; H04L 7/0079; H04L 7/033; H04L 7/0091
See application file for complete search history.

(56) References Cited

U.S. PATENT DOCUMENTS

| 5,771,398 | A | 6/1998 | Park |
| 7,035,985 | B2 | 4/2006 | Bachot |
| 7,069,461 | B1* | 6/2006 | Chan ........................ G11C 5/14 |
| | | | 713/322 |
| 8,026,745 | B2 | 9/2011 | Scott et al. |
| 8,476,940 | B2 | 7/2013 | Kumar |
| 2004/0008733 | A1 | 1/2004 | Wedding |
| 2006/0071687 | A1* | 4/2006 | Kim .................... H04L 25/0272 |
| | | | 326/82 |
| 2010/0201340 | A1* | 8/2010 | Raghavan ........ H03K 19/01852 |
| | | | 323/311 |
| 2011/0026355 | A1 | 2/2011 | Irisawa |

(Continued)

*Primary Examiner* — Shuwang Liu
*Assistant Examiner* — Gina M McKie
(74) *Attorney, Agent, or Firm* — Brinks Gilson & Lione

(57) ABSTRACT

A clock-receiving system may receive a host clock signal on a communications bus from a clock-sending system. Circuitry of a critical path of the clock-receiving system may communicate the clock signal to a multiplexer configured directly behind output driver circuitry. Core logic circuitry and data path circuitry may communicate pairs of phase-shifted data signals to the multiplexer. The multiplexer may use the clock signal and the pairs of phase-shifted data signals to generate an output pair of data signals, and send the output pair of data signals to the output driver circuitry. In turn, the output driver circuitry may generate an output data signal for communication on the communications bus. The clock-receiving system may enable the critical path and use the multiplexer to generate the output data signal when in a low operating voltage mode.

19 Claims, 12 Drawing Sheets

(56) References Cited

U.S. PATENT DOCUMENTS

2011/0096825 A1    4/2011   Hollis
2016/0352338 A1   12/2016   Xiao
2016/0359611 A1   12/2016   Nallani

* cited by examiner

LOOP DELAY OPTIMIZATION FOR MULTI-VOLTAGE SELF-SYNCHRONOUS SYSTEMS

CROSS-REFERENCE TO RELATED APPLICATIONS

This application is a continuation of U.S. Non-Provisional application Ser. No. 14/927,694 (now U.S. Pat. No. 9,859,874), filed Oct. 30, 2015. The contents of U.S. Non-Provisional application Ser. No. 14/927,694 (now U.S. Pat. No. 9,859,874) are incorporated by reference in their entirety.

BACKGROUND

In self-synchronous systems, there may be a critical timing delay, referred to as clock-to-data loop delay (or simply loop delay), for example from the time a clock signal is launched from a host to a device to the time that data requested by the host may be made available by the device. When the host has requested data from the device, the host may launch the clock signal and then expect the requested data within a certain timing window. The clock signal may travel on a clock line to the device, the device may then process the requested data based on the clock signal, and finally the device may make the requested data available to the host by sending the requested data on a data line back to the host. If the data is made available within the timing window, then the read operation may be performed successfully. However, if the data is not made available within the timing window, then the host may determine a timeout event and/or that the device is unable to send the requested data back to the host.

The timing window may be measured in terms of unit intervals (UI). For lower operating frequencies (e.g., around 100 Megahertz (MHz), the timing window may be one unit interval (1UI) in duration. For higher operation frequencies (e.g., 208 MHz), the timing window may be two unit intervals (2UI) in duration. For 2UI timing window configurations, the host may perform a tuning sequence within the 2UI timing window to determine the availability of the requested data, and then align its lock state using delay locked loop (DLL) circuitry.

The host and device may communicate data, clock, and command signals with each other according to an operating voltage. In multi-voltage environments, the operating voltage may be at a first, higher level or at second, lower level. Example operating voltages may be 3.3 Volts (V) and 1.8 V. The transistors configured in a critical path of the device that are used to receive the clock signal from the host and generate the data signal for sending to the host may have a certain gate thickness that optimizes area and reliability. However, the delay caused by the transistors when processing the signals may differ for the different operating voltage levels due to large loading. In particular, when the transistors are operating at the lower voltage level, the delay may be significantly higher, such as around four times greater for example, compared to when the transistors are operating at the higher voltage level. As a result, while the transistors may provide an adequately small amount of delay when operating at the higher voltage level (i.e. a delay that causes data to be available within the specified timing window), they may provide too large of a delay when operating at the lower voltage level (i.e., a delay that causes data to be available only after the timing window has lapsed). So that requested data may be available within the specified timing window, devices configured with reduced loop delay may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF PRESENTLY PREFERRED EMBODIMENTS

Overview

Figure 1:
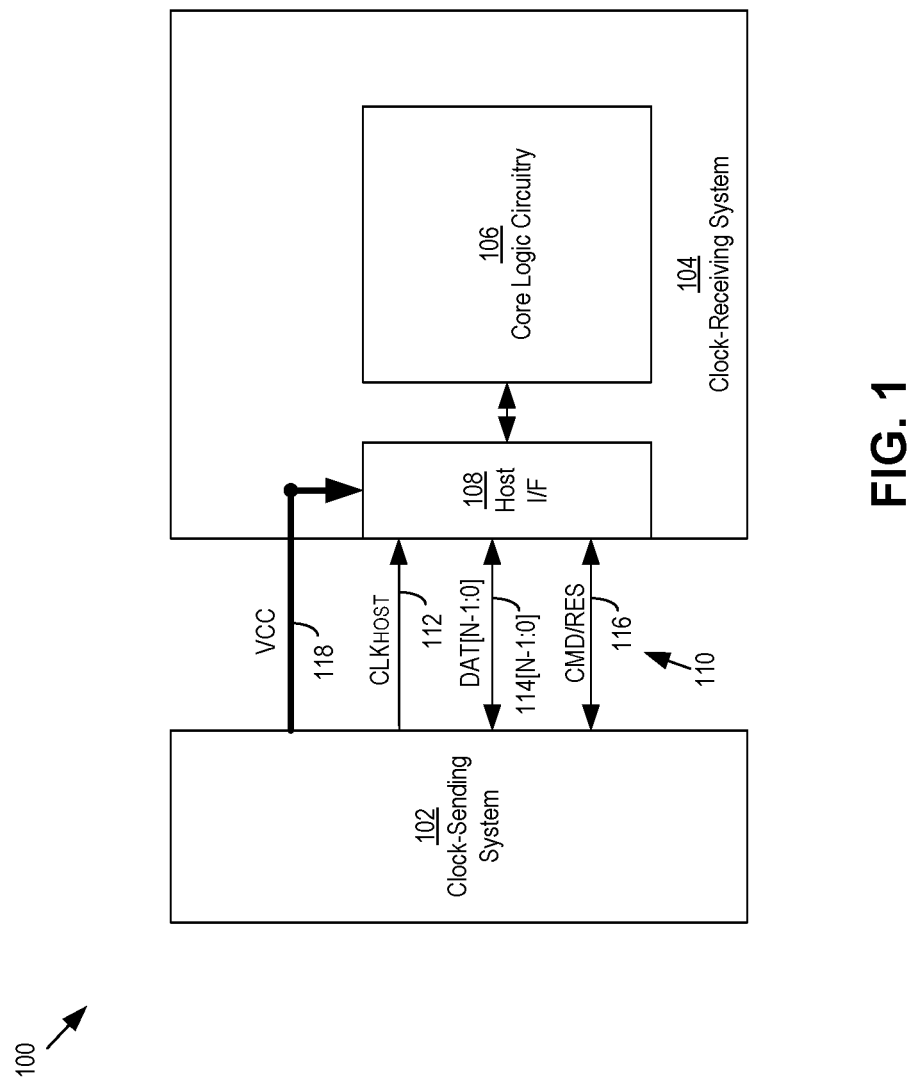
FIG. 1 is a block diagram of an example self-synchronous system.

The following embodiments describe clock-receiving systems of self-synchronous systems that include a critical path configured to communicate a host clock signal to a multiplexer configured directly behind output driver circuitry to reduce loop delay for generation of a data signal on a data line. In some example embodiments, the clock-receiving system may utilize the critical path and the multiplexer for a low operating voltage mode but not for a high operating voltage mode. The output driver circuitry may include two circuit portions, one that generates the data signal in the high operating voltage mode and another that generates the data signal in the low operating voltage mode.

In one example embodiment, a clock-receiving system may include output driver circuitry, critical path circuitry, and a multiplexer circuit. The output driver circuitry may be configured to generate an output data signal for communication on a data line of a communications bus. The critical path circuitry may be configured to generate a clock signal based on a host clock signal received on a clock line of the communications bus. The multiplexer circuit may be configured to: receive a plurality of multiplexer input data signals, receive the clock signal from the critical path circuitry, generate a pair of multiplexer output data signals based on the clock signal and the plurality of multiplexer input data signals, and output the pair of multiplexer output data signals to the output driver circuitry for generation of the output data signal.

In another embodiment, a method of generating an output data signal may be performed. The method may include outputting, with core logic circuitry, a pair of phase shifted core output data signals; generating, with data path circuitry, a plurality of data path output data signals based on the pair of phase shifted core output data signals; generating, with critical path circuitry, a clock signal based on a host clock signal received on a clock line; generating, with a multiplexer circuit, a pair of multiplexer output data signals in response to receiving the plurality of data path output signals from the data path circuitry and the clock signal from the critical path circuitry; and generating, with output driver circuitry, the data signal in response to receiving the pair of multiplexer output data signals from the multiplexer circuit.

In some example embodiments, core logic circuitry maybe configured to enable and disable the first critical path circuitry. Also, second critical path circuitry may be configured to generate a second clock signal based on the host clock signal, and data path circuitry may be configured to, when the first critical path is disabled, generate a pair of data path output data signals based on the second clock signal and output the pair of data path output data signals to the output driver circuitry. The output driver circuitry may be further configured to generate an output data signal in response to receipt of the pair of data path output data signals when the first critical path is disabled.

In some example embodiments, data path circuitry may be configured to generate the plurality of multiplexer input data signals. The plurality of multiplexer input data signals may include a first pair of multiplexer input data signals and a second pair of multiplexer input data signals, where the first and second pairs are phase shifted 180 degrees relative to each other with reference to the clock signal.

In some example embodiments, the multiplexer circuit may include a plurality of pass gate circuits. Each of the pass gate circuits may be configured to receive the clock signal and one of the multiplexer input data signals of the first and second pairs of multiplexer input data signals.

In some example embodiments, the clock signal may include a pair of complementary clock signals.

In some example embodiments, a rate of the clock signal is twice a rate of the plurality of multiplexer input data signals.

In another example embodiment, a clock-receiving system may include output driver circuitry and a multiplexer circuit. The output driver circuitry may be configured to generate an output data signal for communication on a data line of a communications bus. In addition, the output driver circuitry may include a first circuit portion configured to generate the output data signal in a high operating voltage mode, and a second circuit portion configured to generate the output data signal in a low operating voltage mode. The multiplexer circuit may be configured to output and maintain a first set of voltages at a first set of levels to deactivate the second circuit portion in the high operating voltage mode; and output and maintain a second set of voltages at a second set of levels to deactivate the first circuit portion in the low operating voltage mode.

In some example embodiments, core logic circuitry may be configured to control whether the multiplexer circuit is configured to output the first set of voltages in the high operating voltage mode or the second set of voltages in the low operating voltage mode.

In some example embodiments, the core logic circuitry may be configured to, in the high operating voltage mode, output a core output data signal to the multiplexer for generation of the output data signal, and in the low operating voltage mode, output a pair of phase shifted core output data signals to the multiplexer for generation of the output data signal.

In some example embodiments, the multiplexer may be configured to, in the high operating voltage mode, output, to first data path circuitry, a first pair of multiplexer output data signals for generation of the output data signal in response to receipt of the core output data signal, and in the low operating voltage mode, output, to second data path circuitry, a second pair of multiplexer output data signals and a third pair of multiplexer output data signals. The second pair may be associated with a first data signal of the pair of phase shifted core output data signals and the third pair may be associated with a second data signal of the pair of phase shifted core output data signals.

In some example embodiments, in the high operating voltage mode, the first data path circuitry may be configured to generate a first pair of data path output data signals based on the first pair of multiplexer output data signals, and output the first pair of data path output data signals to the first circuit portion of the output driver circuitry for generation of the data signal. Also, in the high operating voltage mode, the second data path circuitry may be configured to generate a third set of voltages at a third set of levels to the second circuit portion of the output driver circuitry for deactivation of the second circuit portion. In the low operating voltage mode, the second data path circuitry may be configured to generate a second pair of data path output data signals based on the second and third pairs of multiplexer output data signals, and output the second pair of data path output signals to the second circuit portion of the output driver circuitry for generation of the data signal. Also, in the low operating voltage mode, the first data path circuitry may be configured to generate a fourth set of voltages at a fourth set of voltage levels to the first circuit portion of the output driver circuitry for deactivation of the first circuit portion.

In some example embodiments, the second data path circuitry may include a pre-driver circuit that includes an output node, and first, second, and third transistor circuitries. The first transistor circuitry may be connected to the output node and configured to be supplied with an input/output (I/O) voltage and pull up a voltage at the output node to a level of the I/O voltage. The second transistor circuitry may be connected to the output node and configured to pull down the voltage at the output node to ground. The third transistor circuitry may be connected to an internal node of the second transistor circuitry and configured to be supplied with a reference voltage, where a level of the reference voltage may be lower than a level of the I/O voltage in the high operating voltage mode.

In some example embodiments, the second data path circuitry may further include level shifter circuitry configured to generate first and second pairs of level shifter output data signals based on the second and third pairs of multiplexer output data signals. Each of the first circuitry, the second circuitry, and the third circuitry of the pre-driver circuitry may include a data signal input connected to a same output of the level shifter circuitry.

In some example embodiments, the method may further include: enabling, with the core logic circuitry, the critical path in response to determining that a host interface is operating in a low operating voltage mode.

In some example embodiments, the multiplexer circuit may include a first multiplexer circuit, and the pair of multiplexer output data signals may include a first pair of multiplexer output data signals, and the data path circuitry may include a first data path circuitry. The method may further include: with a second multiplexer, outputting second and third pairs of multiplexer output data signals in response to receiving the pair of phase shifted core output data signals from the core logic circuitry to the first data path circuitry, while outputting a first pair of voltages at constant levels to second data path circuitry; and outputting, with the second path circuitry, a second pair of voltages at constant levels based on the first pair of voltages. For these example embodiments, generating the plurality of data path output data signals with the first data path circuitry may be based on the second and third pairs of multiplexer output data signals, and generating the output data signal may include generating, with a first circuit portion of the output driver circuitry, the output data signal in response to receiving the first pair of multiplexer output data signals while a second circuit portion of the output driver circuitry is deactivated in response to receiving the second pair of voltages.

Other embodiments are possible, and each of the embodiments can be used alone or together in combination. Accordingly, various embodiments will now be described with reference to the attached drawings.

Exemplary Embodiments

As mentioned in the background section, transistors in a critical path of a device operating in a self-synchronous system may provide too long of a clock-to-data loop delay (or simply loop delay) when the device is operating according to a lower operating voltage such that the device is unable to make requested data available to a host system within a timing window that is recognized and monitored by the host system. The following embodiments show an example device that reduces the loop delay for host clock signals generated at a lower of two operating voltages for which the device is designed. In particular, the device includes two critical paths associated with two different operating voltage levels. Each critical path includes circuitry configured to receive a host clock signal on a clock line from a host and, based on the received host clock signal, generate a clock signal that is used to generate a data signal for communication on a data line back to the host. The critical path associated with the lower of the two operating voltage levels may provide shorter loop delay for the host clock signal at the lower voltage level compared to the loop delay provided by the critical path associated with the high voltage level for that same host clock signal. The device may be configured to detect the operating voltage level, and based on the detection, enable one of the critical paths while disabling the other.

FIG. 1 shows a block diagram of an example self-synchronous system 100 that includes a clock-sending system 102 and a clock-receiving system 104. In the self-synchronous system 100, the clock-sending system 102 may send a clock signal to the clock-receiving system 104, and the clock-receiving system 104 may be configured to operate and communicate with the clock-sending system 102 using the clock signal.

In some examples, the clock-sending system 102 may be a host or a master device or system, and the clock-receiving system 104 may be a slave device or system. In addition or alternatively, the clock-receiving system 102 may have or store information or data that the clock-sending device 102 wants. The clock signal sent by the clock-sending system 102 may be used in order to transfer the desired information or data from the clock-receiving system 104 to the clock-sending system 102. As used herein, the clock signal sent by the clock-sending system 102 may be referred to as a host clock signal.

At a given point in time or period of operation, the clock-sending system 102 may be configured to send the host clock signal at one of a plurality of different operating voltage levels. Which level the clock signal is sent may depend on the configuration of the clock-sending system 102, a protocol under which the clock-sending and/or clock-receiving systems 102, 104 are configured to operate, and/or an operation mode at which the clock-sending system 102 and/or the clock-receiving system 104 are operating. As described in further detail below, the clock-receiving system 104 may include two critical paths for communication of the host clock signal in order to send the requested data back to the clock-sending system 102. Which path the clock-receiving system 104 enables and which path the clock-receiving system 104 disables may depend on the level of the operating voltage.

The clock-receiving system 104 may include core logic circuitry 106 that may perform functions specific to the clock-receiving system 104. Generally, the core logic circuitry 106 may have or obtain the data or information that the clock-sending 102 has requested. The clock-receiving system 104 may also include a host interface 108 to communicate with the clock-sending system 102. The host interface 108 may be coupled to a communications bus 110 on which the host interface 108 sends and receives signals to and from the clock-sending system 102. As described in further detail below, the host interface 108 may include driver circuitry configured to generate the signals, such as by pulling up to a high level and pulling down to a low level voltages on the lines of the communications bus 110.

The communications bus 110 may include a host clock line 112 on which the clock-sending system 102 may send a host clock signal $CLK_{HOST}$ to the clock-receiving system 104; an N-number of data lines 114[N−1:0] on which the clock-sending system 102 and the clock-receiving system 104 may communicate data signals DAT[N−1:0] with each other; and a command line 116 on which the clock-sending system 102 and the clock-receiving system 104 may communicate command signals CMD and responses RES with each other. The data signals DAT[N−1:0] may include data that the clock-sending system 102 wants to receive from the clock-receiving system 104. Command signals CMD sent from the clock-sending system 102 may instruct or request that the clock-receiving system 104 perform some action, such as perform an operation, transition into a certain state, or respond with requested data or information, as examples. The response signals RES sent from the clock-receiving system 104 may acknowledge receipt of the command signals CMD, indicate that the instructed/action is performed, or include the requested information, as examples. As described in further detail below, the host clock signal $CLK_{HOST}$ may set the frequency at which data and/or commands CMD are communicated on the communications bus 110 and/or control the data flow by providing the times and/or rates at which the host clock signal $CLK_{HOST}$ and data signals DAT[N−1:0] may be sampled by the clock-receiving system 104.

The clock-sending system 102 and the clock-receiving system 104, using the host interface 108, may be configured to generate and communicate the clock, data, and command/response signals $CLK_{HOST}$, DAT[N−1:0], CMD/RES in and/or corresponding to at least one of a plurality of operating voltage domains. The plurality of operating voltage domains may include at least two operating voltage domains: a high operating voltage domain and a low operating voltage domain. For some example configurations, more than two operating voltage domains may be possible.

Each of the operating voltage domains may have an associated high voltage level and an associated low voltage level. Additionally, each of the operating voltage domains may have an associated high voltage range within which the associated high voltage level lies and an associated low voltage range within which the associated low voltage level lies. The high voltage level associated with the high operating voltage domain may be higher than the high voltage level associated with the low operating voltage domain. A signal generated in a particular operating voltage domain may transition between a high level that is within the associated high voltage range and a low level that is within the associated low voltage range.

The clock-sending system 102 and the clock-receiving system 104 using the host interface 108 may be configured to generate and communicate the clock, data, and command signals $CLK_{HOST}$, DAT[N−1:0], CMD/RES in the high operating voltage domain, the low operating voltage domain, or both. As used herein for simplicity, and unless otherwise specified, a signal being generated and/or communicated in the high operating voltage domain or the low operating voltage domain may be synonymous and/or used interchangeably with a signal being generated and/or communicated at and/or according to a high operating voltage level or a low operating voltage level, respectively, where the high operating voltage level refers to the high voltage level associated with the high operating voltage domain and the low operating voltage level refers to the high voltage level associated with the low operating voltage domain. In other words, as used herein, a signal generated and/or communicated at and/or according to the high operating voltage level may mean that the high level of the signal is at the associated high voltage level and/or within the associated high voltage range of the high operating voltage domain. Likewise, a signal generated and/or communicated at and/or according to the low operating voltage level may mean that the high level of the signal is at the associated high voltage level and/or within the associated high voltage range of the low operating voltage domain. Similarly, as used herein, a voltage generated, supplied to, and/or received by a circuit component (e.g., a transistor) at and/or according to the high operating voltage domain and/or the high operating voltage level may mean that the level of the voltage is at the associated high voltage level and/or within the associated high voltage range of the high operating voltage domain. Likewise, a voltage generated in/at, supplied to, and/or received by a circuit component at and/or according to the low operating voltage domain and/or the low operating voltage level may mean that the level of the voltage is at the associated high voltage level and/or within the associated high voltage range of the low voltage domain.

In one example configuration, the high operating voltage domain may be a 3.3 V operating voltage domain, and the low operating voltage domain may be a 1.8 V operating voltage domain. A signal generated in the 3.3 V operating voltage domain and/or according to the 3.3 V operating voltage level may transition between a high level corresponding to 3.3 V (i.e., at 3.3 V and/or within a voltage range associated with 3.3 V) and a low level corresponding to 0 V (i.e., at 0 V and/or within a voltage range associated with 0 V). Similarly, a signal generated in the 1.8 V operating voltage domain and/or according to the 1.8 V operating voltage level may transition between a high level corresponding to 1.8 V (i.e., at 1.8 V and/or within a voltage range associated with 1.8 V) and a low level corresponding to 0 V. Likewise, a voltage generated at and/or according to the 3.3 V operating voltage may have a level that is at 3.3 V and/or that is within a voltage range associated with 3.3 V, and a voltage generated at and/or according to the 1.8 V operating voltage may have a level that is at 1.8 V and/or that is within a voltage range associated with 1.8 V. High and low levels for the operating voltage domains other than or in addition to 3.3 V and 1.8 V may be possible.

In addition, as shown in FIG. 1, the clock-sending system 102 may supply a supply voltage VCC on a supply line 118 to the clock-receiving system 104 to power components of the clock-receiving system 104. Voltages supplied to circuit components of the clock-receiving system 104 may be generated based on the supply voltage VCC. For example, although not shown in FIG. 1, the host interface 108 may include a regulator that receives the supply voltage VCC. Based on receipt of the supply voltage VCC, the regulator may be configured to generate a voltage at the high operating voltage level or the low operating voltage level, and provide the voltage to other circuit components of the host interface 108.

The host interface 108 may be configured to operate in both a high operating voltage mode and a low operating voltage mode. When the host interface 108 is communicating with the clock-sending system 102 via the communications bus 110 in the high operating voltage domain, then the host interface 108 may be operating in the high operating voltage mode, and vice versa. Conversely, when the host interface 108 is communicating with the host system 102 via the communications bus 110 in the low operating voltage domain, then the host interface 108 may be operating in the low operating voltage mode, and vice versa.

When the clock-sending system 102 requests that the clock-receiving system 104 send it data, the core logic circuitry 106 may provide the data to the host interface 108, which in turn may send the data as data signals DAT[N−1:0] to the clock-sending system 102 on the N-number of data lines 118[N−1:0].

The clock-receiving system 104 may use the host clock signal $CLK_{HOST}$ received on the clock line 112 to generate the data signals DAT[N−1:0] that are sent back to the clock-sending system 102. In particular, certain circuit components of the host interface 108 and/or the core logic circuitry 106 may receive the host clock signal $CLK_{HOST}$, or at least a buffered version of the host clock signal $CLK_{HOST}$, and pull up and down the levels of the data signals DAT[N−1:0] according to the rate of the host clock signal (i.e., according to the rising and/or falling edge occurrences of the host clock signal).

The clock-sending system 102 may be configured to monitor and/or keep track of a timing window when requesting data from the clock-receiving system 104. The clock-sending system 102 may identify an initial or starting time of the timing window, which may correspond to an initial time that the host system 102 sends the host clock signal CLH$_{HOST}$ and/or a clock pulse of the host clock signal CLK$_{HOST}$ that the clock-sending system 102 sends for the requested data to be sent back to the host system 102 on the data lines 114[N−1:0]. In some example configurations, the timing window may correspond to a number of unit intervals (UI), where each UI corresponds to a single time period or cycle of the host clock signal CLK$_{HOST}$. If the clock-sending system 102 has not received at least some of the requested data on the data lines 114[N−1:0] upon expiration of the timing window, the clock-sending system 102 may identify a timeout event and/or determine that the clock-receiving system 104 is unable or unavailable to send the requested data to the clock-sending system 102. As a result, the request for the data may not be completed.

A critical path of the clock-sending system 104 may be a path along which the host clock signal CLK$_{HOST}$ propagates within the clock-sending system 104 to generate the data signals DAT[N−1:0]. Whether the data signals DAT[N−1:0] are able to be generated and sent out on the data lines 114[N−1:0] within the timing window may depend on the critical path and the delay provided by the critical path to communicate the host clock signal CLK$_{HOST}$ and generate the data signals DAT[N−1:0] using the host clock signal CLK$_{HOST}$. The delay provided by the critical path may be referred to as a clock-to-data loop delay (or simply loop delay). The shorter the loop delay, the faster the host interface 108 of the clock-receiving system 104 may generate the data signals DAT[N−1:0] on the data lines 114[N−1:0] for sending back to the clock-sending system 102.

The clock-receiving system 104 may include two critical paths to communicate the host clock signal CLK$_{HOST}$ and generate a data signal with the host clock signal CLK$_{HOST}$ for communication on a data line back to the clock-sending system 102. The two critical paths may include a first critical path to communicate the host clock signal CLK$_{HOST}$ and generate a data signal using the host clock signal CLK$_{HOST}$ when the host interface 108 is operating in the high operating voltage mode, and a second critical path to communicate the host clock signal CLK$_{HOST}$ and generate the data signal using the host clock signal CLK$_{HOST}$ when the host interface 108 is operating in the low operating voltage mode.

Figure 2:
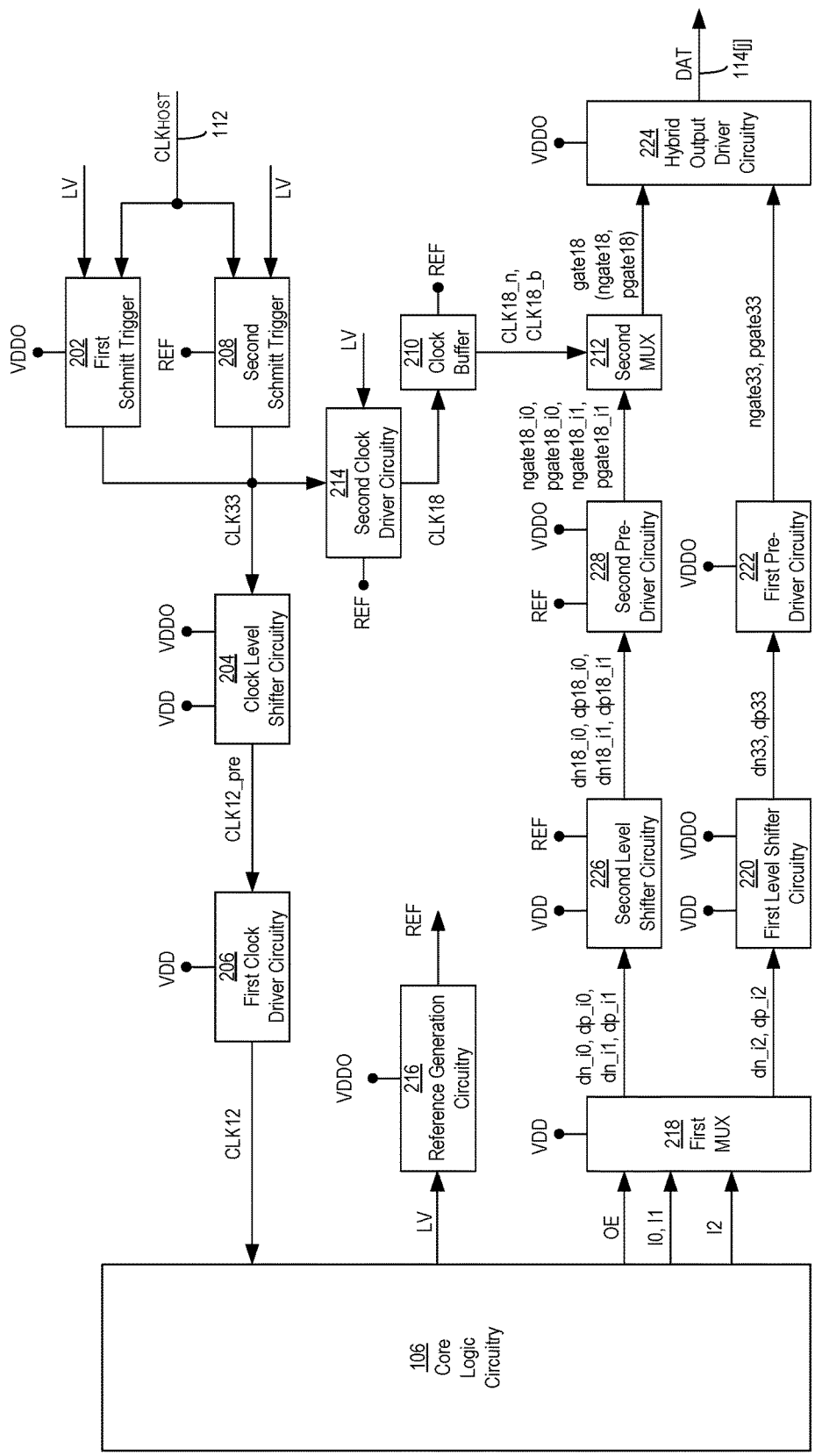
FIG. 2 is a block diagram of components of a clock-receiving system of the self-synchronous system of FIG. 1 that may be included in a first critical path and a second critical path of the non-volatile memory system.

FIG. 2 shows a block diagram of circuit components of the clock-receiving system 104 that may be included in the first and second critical paths. For some example configurations, other than the core logic circuitry 106, the circuit components shown in FIG. 2 may be part of the host interface 108 shown in FIG. 1, although in other example configurations, one or more of the circuit components may be separate from the host interface 108. The first critical path and the second critical path may each be configured to generate a clock signal based on the host clock signal CLK$_{HOST}$ and then use that clock signal to generate a data signal, which in turn may be converted into a data signal DAT that is communicated on a jth data line 114[j] of the N-number of data lines 114[N−1:0] back to the clock-sending system 102. When the host interface 108 is operating in the high operating voltage mode, the data signal DAT may be generated based on the data signal generated with the first critical path. Alternatively, when the host interface 108 is operating in the low operating voltage mode, the data signal DAT may be generated based on the data signal generated with the second critical path. The second critical path may provide shorter loop delay to generate the data signal DAT compared to the first critical path.

In further detail, the first critical path associated with the high operating voltage level may include a first Schmitt trigger 202, clock level shifter circuitry 204, first clock driver circuitry 206, and data generation circuitry 216 located in the core logic circuitry 106. The circuit components of the first critical path may be configured to receive the host clock signal CLK$_{HOST}$ on the host clock line 112 and generate a first clock signal CLK12 based on the host clock signal CLK$_{HOST}$. The second critical path associated with the low operating voltage level may include a second Schmitt trigger 208, second clock driver circuitry 214, a clock buffer 210, and a second multiplexer (MUX) 212. The circuit components of the second critical path may be configured to receive the host clock signal CLK$_{HOST}$ on the host clock line 112 and generate a second clock signal CLK18 based on the host clock signal CLK$_{HOST}$.

When the host interface 108 is operating in the high operating voltage mode, a data signal I2 may be generated by the core logic circuitry 106 with or using the first clock signal CLK12. As described in further detail below, the data signal I2 may then be converted, using additional circuitry, into the data signal DAT that is communicated on the jth data line 114[j]. However, after the data signal I2 is generated, further or additional clock signals may not be used to convert the data signal I2 to the data signal DAT. Alternatively, when the host interface 108 is operating in the low operating voltage mode, a data signal gate18, which may include a pair of directly aligned data signals ngate18 and pgate18, may be generated by the second multiplexer 212 with or using the second clock signal CLK18. As described in further detail below, the data signal gate18 may then be converted, using additional circuitry, into the data signal DAT. However, after the data signal gate18 is generated, further or additional clock signal may not be used to convert the data signal gate18 to the data signal DAT.

The core logic circuitry 106 may be configured to determine whether the host interface 108 is operating in the high operating voltage mode or the low operating voltage mode. Based on the determination, the core logic circuitry 106 may be configured to generate a path enable signal LV that enables or disables the second critical path. That is, when the core logic circuitry 106 determines that the host interface 108 is operating in the low operating voltage mode, the core logic circuitry 108 may generate the path enable signal LV to enable the second critical path, and when the core logic circuitry 106 determines that the host interface 108 is operating in the high operating voltage mode, the core logic circuitry 108 may generate the path enable signal LV to disable the second critical path. When the second critical path is enabled, the second clock signal CLK18 may be used to generate a data signal for communication on the jth data line 114[j]. Alternatively, when the second critical path is disabled, the first clock signal CLK12 may be used to generate a data signal for communication on the jth data line 114[j].

In further detail, as shown in FIG. 2, each of the first Schmitt trigger 202, the second Schmitt trigger 208, and the second clock driver circuitry 214 may be configured to receive the path enable signal LV. In addition, each of the first Schmitt trigger 202 and the second Schmitt trigger 208 may be configured to receive the host clock signal CLK$_{HOST}$ on the clock line 212.

When the core logic circuitry 106 determines that the host interface 108 is operating in the high operating voltage mode, the core logic circuitry 106 may generate the path enable signal LV such that the first Schmitt trigger 202 is enabled while the second Schmitt trigger 208 and the second clock driver circuitry 214 are disabled in response to the path enable signal LV. Alternatively, when the core logic circuitry 106 determines that the host interface 108 is operating in the low operating voltage mode, the core logic circuitry 106 may generate the path enable signal LV such that the first Schmitt trigger 202 is disabled while the second Schmitt trigger 208 and the second clock driver circuitry 214 are enabled in response to the path enable signal LV.

In the high operating voltage mode, with the first Schmitt trigger 202 activated and the second Schmitt trigger 208 deactivated, the first Schmitt trigger 202 may generate a clock signal CLK33 based on the host clock signal CLK$_{HOST}$ and output the clock signal CLK33 to the clock level shifter circuitry 208 and the second clock driver circuitry 214. As described in further detail below, the clock level shifter circuitry 208 and the first clock driver circuitry 206 of the first critical path may then convert the clock signal CLK33 into the first host clock signal CLK12 and send the first host clock signal to the core logic circuitry 106. Using the first clock signal CLK12, the core logic circuitry 106 may generate the data signal I2, which in turn may be converted to the data signal DAT without use of further clocking. Also, since the second clock driver circuitry 214 is deactivated in the high operating voltage mode, the second clock signal CLK18 may not be generated with the second critical path in order to generate the data signal DAT.

Alternatively, in the low operating voltage mode, with the first Schmitt trigger 202 deactivated and the second Schmitt trigger 208 activated, the second Schmitt trigger 208, rather than the first Schmitt trigger 202, may generate the clock signal CLK33 based on the host clock signal CLK$_{HOST}$ and output the clock signal CLK to the clock level shifter circuitry 208 and the second clock driver circuitry 214. As described in further detail below, though in the low operating voltage mode, the clock level shifter circuitry 204 and the first clock driver circuitry 206 may still generate the first clock signal CLK12 for use by the core logic circuitry 106. However, the second clock driver circuitry 214, being activated, may generate the second clock signal CLK18, and the second multiplexer 212 may generate the data signal gate18 for generation of the data signal DAT based on the second clock signal CLK18.

In the high operating voltage mode, the second critical path may be considered disabled since it is not used to generate the data signal DAT. In the low operating voltage mode, the second critical path may be considered enabled since it is used to generate the data signal DAT. Enabling and disabling the second critical path is described in further detail below.

The circuit components shown in FIG. 2 may each receive and be powered by one or more of a plurality of voltages, including an IO voltage VDDO, a core voltage VDD, and a reference voltage REF. The IO voltage VDDO is generated at the high operating voltage level when the host interface 112 is operating in the high operating voltage mode, and is generated at the low operating voltage level when the host interface 112 is operating at the low operating voltage mode. The IO voltage VDDO may be generated using regulator circuitry or other voltage generation circuitry of the clock-receiving system 104 based on the supply voltage VCC. Setting the IO voltage VDDO to be at the high operating voltage level or the low operating voltage level is outside the scope of the present description.

In addition, the level of the core voltage VDD may be the level at which the core logic circuitry 106 operates. In general, the level of the core voltage VDD may be lower than the low operating voltage level. In one example configuration, the level of the core voltage VDD may be 1.2 V, while the low operating voltage level is 1.8 V and the high operating voltage level is 3.3 V.

The reference voltage REF may be generated at the low operating voltage level, and may be generated at that level both when the host interface 108 is operating in the high operating voltage mode and in the low operating voltage mode. As described in further detail below, the reference voltage REF may be used to generate the second clock signal CLK18 and the complimentary clock signals CLK18_n, CLK18_b provided to the second multiplexer 212. Additionally, when the host interface 108 is operating in the high power mode, the reference voltage REF may be used to protect certain circuit components (e.g., transistors) that are used for generation of the data signals in the low operating voltage mode.

As shown in FIG. 2, reference generation circuitry 216 may be included to generate the reference voltage REF. The reference generation circuitry 216 may receive the IO voltage VDDO. Additionally, the reference generation circuitry 216 may receive the path enable signal LV in order to generate the reference voltage REF at the low operating voltage level when the IO voltage VDDO is either at the low operating voltage level or the high operating voltage level.

Figure 3:
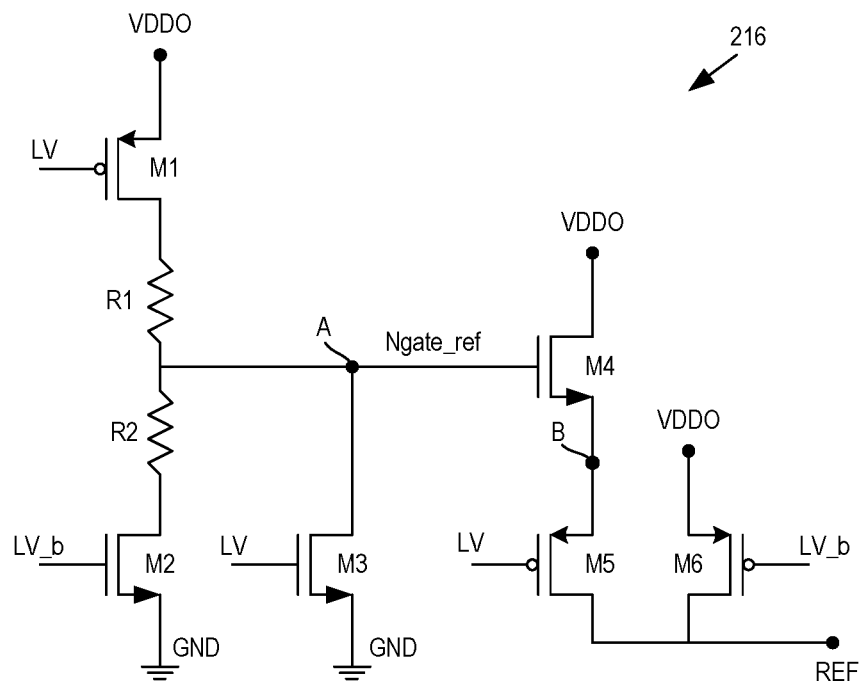
FIG. 3 is a circuit schematic diagram of reference generation circuitry configured to generate a reference voltage.

FIG. 3 shows a circuit schematic diagram of an example circuit configuration for the reference generation circuitry 216. The example circuit configuration may include a first p-channel metal-oxide-semiconductor field-effect transistor (PMOS transistor) M1 having a source terminal configured to receive the IO voltage VDDO, a drain terminal connected to a first end of a first resistor R1, and a gate terminal configured to receive the path enable signal LV. In the circuit configuration shown in FIG. 3, the path enable signal LV may be generated at a logic low level (e.g., 0 V) when the host interface 112 is in the high operating voltage mode and at a logic high level when the host interface 112 is in the low operating voltage mode. The logic high level may be the high operating voltage level.

A first n-channel metal-oxide-semiconductor field-effect transistor (NMOS transistor) M2 may include a drain terminal connected to a first end of a second resistor R2, a source terminal connected to a ground reference voltage GND, and a gate terminal connected to an inverse path enable signal LV_b. (Inverter circuitry to invert the path enable signal LV in order to generate the invert path enable signal LV_b is not shown for simplicity). The level of the inverse path enable signal LV_b may be the inverse of the level of the path enable signal LV_b. Accordingly, when the host interface 112 is in the high operating voltage mode, the path enable signal LV may be at its logic low level (e.g., 0 V) and the inverse path enable signal LV_b may be at a logic high level, which may be the high operating voltage level. Further, when the host interface 112 is in the low operating voltage mode, the path enable signal LV may be at its logic high level (i.e., the low operating voltage level), and the inverse path enable signal LV_b may be at a logic low level (e.g., 0V).

Additionally, second ends of the first and second resistors R1, R2 may be connected together at a node A. A second NMOS transistor M3 may have a drain terminal connected to node A, a source terminal connected to the ground reference voltage GND, and a gate terminal configured to receive the path enable signal LV. A transistor M4 may have a drain terminal configured to receive the IO voltage VDDO, a gate terminal connected to node A, and a source terminal connected to a source terminal of a second PMOS transistor M5 at a node B. The second PMOS transistor M5 may have a gate terminal configured to receive the path enable signal LV, and a drain terminal connected to a reference node at which the reference voltage REF is generated. A third PMOS transistor M6 may have a source terminal configured to receive the IO voltage VDDO, a gate terminal configured to receive the inverse path enable signal LV_b, and a drain terminal connected to the reference node at which the reference voltage REF is generated.

For some example configurations, the transistor M4 may be a native Vt (NVT) transistor that operates as a source follower. In particular, the threshold voltage Vth of the transistor M4 may be at or near 0 V such that the voltage generated at node B follows the voltage generated at node A. Using a NVT transistor for the transistor M4, the reference voltage REF may be equal to the voltage at node A when the second PMOS transistor M5 is turned on. In other example configurations, a NMOS transistor with a threshold voltage greater than 0 V may be used for the transistor M4. For these other example configurations, the voltage generated at node A may be increased by the threshold voltage of the NMOS transistor in order to generate a desired reference voltage REF.

In the high operating voltage mode, the first PMOS transistor M1 may be turned on, the first NMOS transistor M2 may be turned on, and the second NMOS transistor M3 may be turned off. As a result, a voltage Ngate_ref may be generated at node A at a level that turns on the third NMOS transistor M4. Also, the voltage at node B may be equal to the voltage Ngate_ref less the threshold voltage Vth of the transistor M4 (where the transistor M4 is configured as a NVT transistor, the voltage Vgate_ref may also be generated at node B since the threshold voltage Vth may be zero). With the path enable signal LV at the logic low level, the second PMOS transistor M5 may be turned on, and the third PMOS transistor M6 may be turned off. With the transistors M1-M6 in their respective on and off states, the level of the voltage generated at node B may be about the low operating voltage level and/or, in some configurations, may be about 55% of the high operating voltage level. With the second PMOS transistor M5 turned on, the level of the reference voltage REF may be about the same as the level of the voltage generated at node B.

In the low operating voltage mode, the first PMOS transistor M1 may be turned off, the first NMOS transistor M2 may be turned off, and the second NMOS transistor M3 may be turned on. As a result, the voltage Ngate_ref may be pulled down such that the transistor M4 is turned off. The second PMOS transistor M5 may also be turned off, and the third PMOS transistor M6 may be turned on. With the transistors M1-M6 in their respective on and off states, the level of the reference voltage REF may be about the level of the IO voltage VDDO, which in the low operating voltage mode is the low operating voltage level. Accordingly, the level of the reference voltage REF is about the same regardless of whether operation is in the high or the low operating voltage mode.

Figure 4:
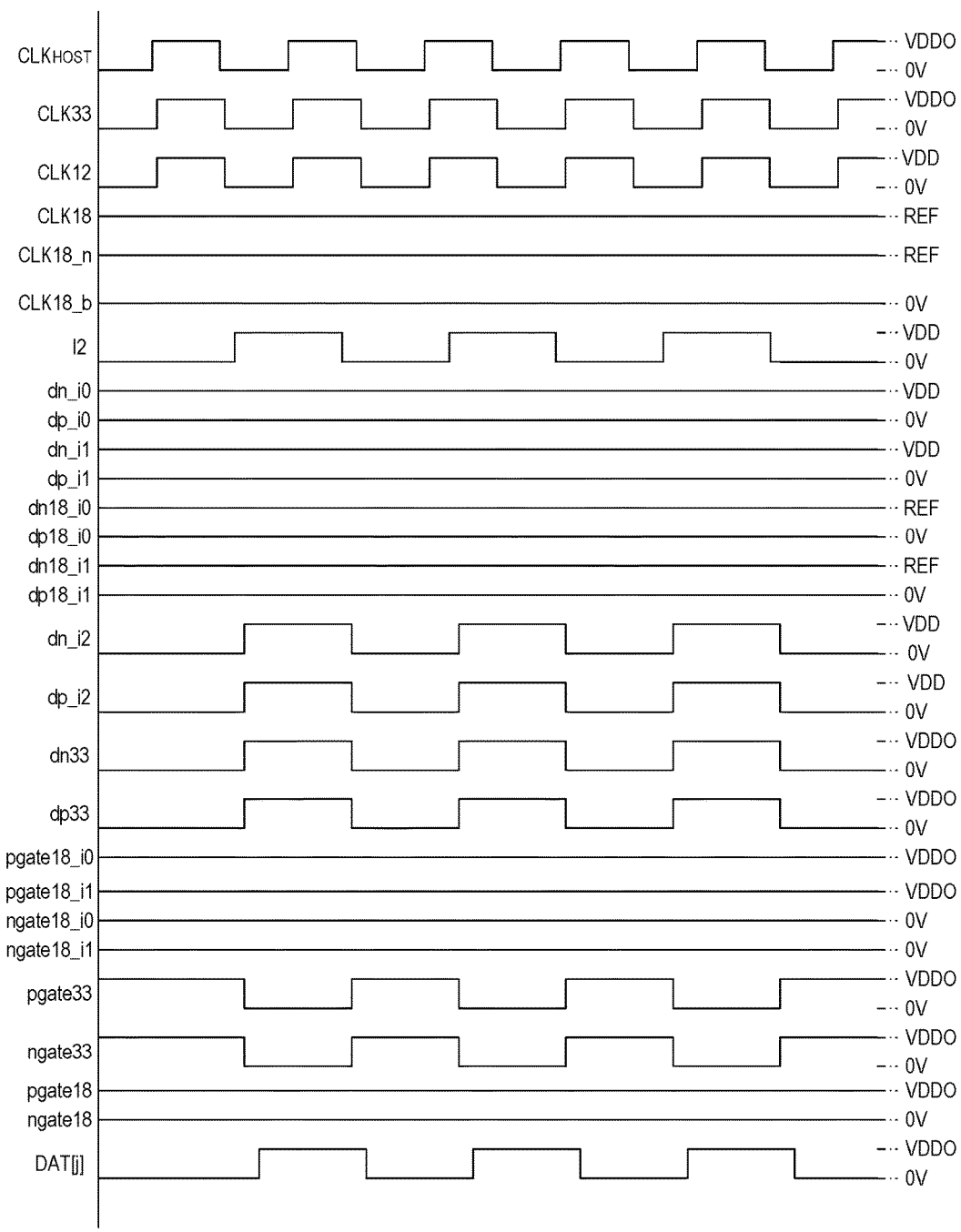
FIG. 4 is a timing diagram of signals generated by the components shown in FIG. 2 when the clock-receiving system is operating in a high voltage mode of operation.

Referring back to FIG. 2, generation of the data signal DAT when the host interface 112 is in the high operating voltage mode is now described. Reference is also made to FIG. 4, which shows a timing diagram of data signals and clock signals that are generated with the circuit components shown in FIG. 2 when the host interface 112 is in the high operating voltage mode. For simplicity, an accurate depiction of relative delay between rise times and fall times among the signals in FIG. 2 is omitted.

As previously described, in the high operating voltage mode, the path enable signal LV may enable the first Schmitt trigger 202 and disable the second Schmitt trigger 208. In response, the first Schmitt trigger 202 may generate the clock signal CLK33 and output the clock signal CLK33 to the clock level shifter circuitry 204. As shown in FIG. 2, the clock level shifter circuitry 204 may receive the IO voltage VDDO and the core voltage VDD. The clock level shifter circuitry 204 may be a high-to-low level shifter in that the clock level shifter circuitry 204 may convert the clock signal CLK33 in the high operating voltage domain to a level-shifted clock signal CLK12_pre in the core voltage domain. The level-shifted clock signal CLK12_pre may be output to the clock driver circuitry 206. In response, the clock driver circuitry 206 may generate and output the first clock signal CLK12 to the core logic circuitry 106.

As previously described, the core logic circuitry 106 may be configured to generate the data signal I2 using the first clock signal CLK12. The data signal I2 may include data that the clock-receiving system 104 wants to send to the clock-sending system 102 and/or data that the clock-sending system 102 wants to receive from the clock-receiving system 104. The data may include data that the core logic circuitry 106 has internally generated, stored, retrieved from another component of the clock-receiving system 104, from a component external the clock-receiving system 104, or some combination thereof. Using the first clock signal CLK12 to generate the data signal I2 may mean that the core logic circuitry 106 responds to the transitions (rising edge and/or falling edge transitions) of the first clock signal CLK12 to generate the data signal I2, such as by switching or operating in response to transitions of the first clock signal CLK12 and/or transitioning the data signal I2 between high and low levels in response transitions of the first clock signal CLK12.

After the data signal I2 is generated by the core logic circuitry 106, the core logic circuitry 106 may output the data signal I2 to a first data path associated with the high operating voltage mode. Circuit components of the first data path may convert the data signal I2 to the data signal DAT. The first data path may include a first multiplexer (MUX) 218, first level shifter circuitry 220, first pre-driver circuitry 222, and a hybrid output driver circuitry 224. The hybrid output driver circuitry 224 may be the circuitry that generates the data signal DAT and outputs the data signal DAT on the jth data line 114[j], whether the host interface 108 is in the high operating voltage mode or the low operating voltage mode.

In further detail, in response to receipt of the data signal I2 from the core logic circuitry 106, the first multiplexer (MUX) 218 may generate data signals dn_i2, dp_i2 based on the data signal I2. As shown in FIG. 4, the data signals dn_i2, dp_i2 may be directly aligned with each other, as well as directly aligned with the data signal I2. As used herein, two signals are directly aligned with each other when they transition high together and transition low together, not accounting for delay between the signals. Further, as used herein, signals are inversely aligned if when one signal transitions high, the other transitions low, not accounting for delay between the two signals.

In addition, as shown in FIG. 2, the first multiplexer 218 may receive and be powered by the core voltage VDD. Accordingly, the data signals dn_i2, dp_i2 output by the first multiplexer 218 may be generated in the core voltage domain, as shown in FIG. 4. The first multiplexer 218 may send the pair of data signals dn_i2, dp_i2 to the first level shifter circuitry 220. As shown in FIG. 2, the first level shifter circuitry 220 may receive and be powered by the core voltage VDD and the IO voltage VDDO. The first level shifter circuitry 220 may be a low-to-high level shifter that converts the data signals dn_i2, dp_i2 in the core voltage domain to data signals dn33, dp33 in the high operating voltage domain. As shown in FIG. 4, the data signals dn_33, dp_33 are directly aligned with each other, as well directly aligned with the data signals dn_i2, dp_i2 and the data signal I2.

The first level shifter circuitry 220 may send the data signals dn33, dp33 to first pre-driver circuitry 222, which in turn may generate data signals ngate33, pgate33 and output the data signals ngate33, pgate33 to the hybrid output driver circuitry 224. As shown in FIG. 4, the data signals ngate33, page33 are directly aligned with each other and inversely aligned with the data signals dn33, dp33. In response to receiving the data signals ngate33, pgate33, the hybrid output driver circuitry 224 may be configured to generate the data signal DAT in the high operating voltage domain and send the data signal DAT on the jth data line 118[j] to the host system 102. As shown in FIG. 4, the data signal DAT is inversely aligned with the data signals ngate33, pgate33.

In general, the first level shifter circuitry 220 may be unable to directly drive the capacitive load of the input of the hybrid output driver circuitry 224 with the data signals dn33, dp33. As such, the first pre-driver circuitry 222 may be positioned in between the first level shifter circuitry 220 and the hybrid output driver circuitry 224. The first pre-driver circuitry 220 may have an input capacitive load that the first level circuitry 220 is able to drive, and the first pre-driver circuitry 222 may generate enough current at its output such that it is capable of driving the input capacitive load of the hybrid output driver circuitry 224.

Figure 5:
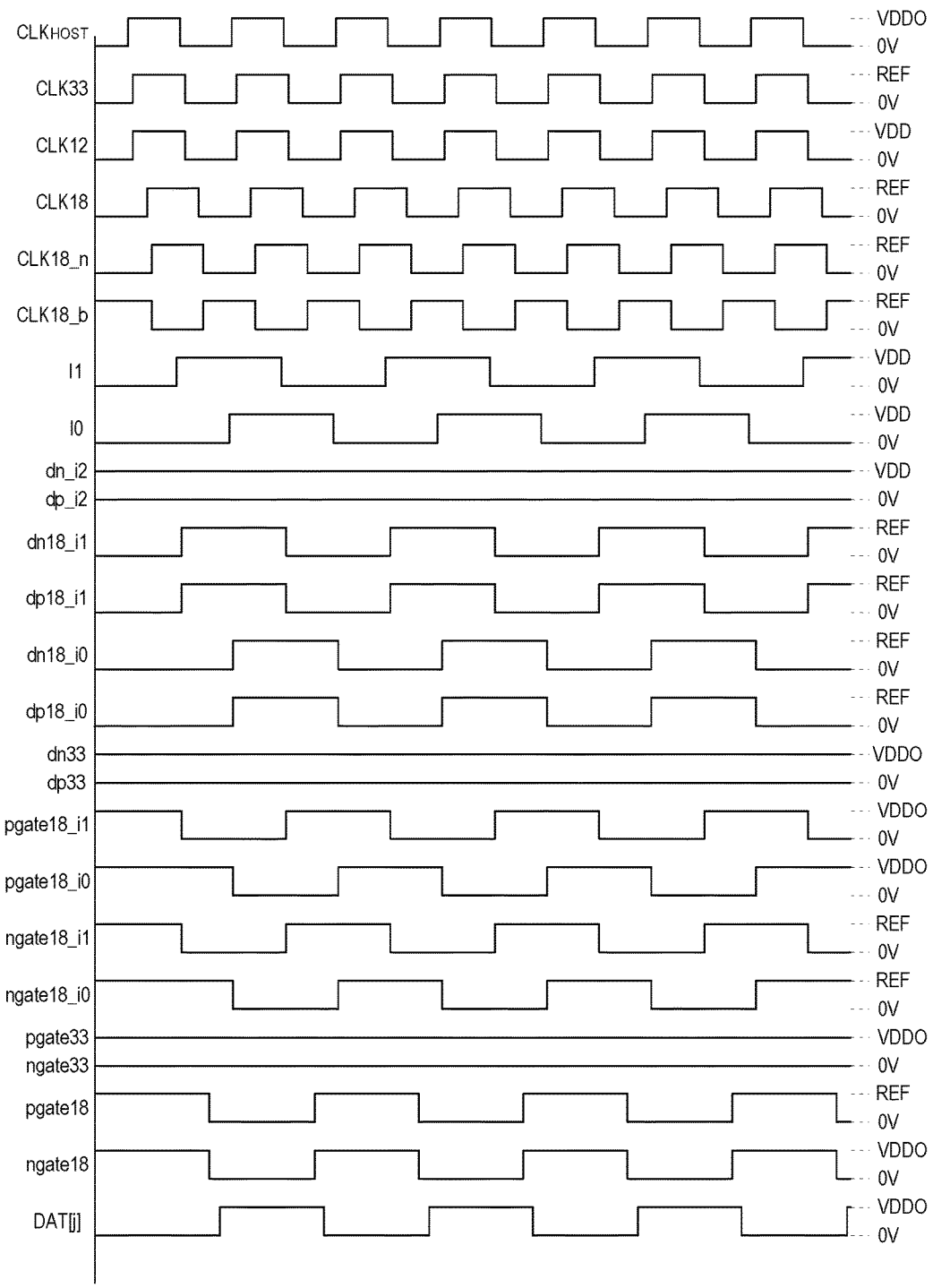
FIG. 5 is a timing diagram of signals generated by the components shown in FIG. 2 when the clock-receiving system is operating in a low voltage mode of operation.

In addition to a first data path, the host interface 112 may also include a second data path used to generate the data signal DAT on the data line 114[j] when the host interface 112 is in the low operating voltage mode. The second data path may include the first multiplexer 218, second level shifter circuitry 226, second pre-driver circuitry 228, the second multiplexer 212, and the hybrid output driver circuitry 224. Generation of the data signal DAT with the second data path and the second critical path when the host interface 112 is in the low operating voltage mode during performance of a read operation is now described. Reference is also made to FIG. 5, which shows a timing diagram of the data signals and clock signals that are generated with the circuit components of FIG. 2 when the host interface 112 is in the low operating voltage mode.

When the host interface 112 is in the low operating voltage mode, the path enable signal LV may enable the second Schmitt trigger 208 and disable the first Schmitt trigger 202. In response, the second Schmitt trigger 208 may generate the clock signal CLK33 and output the clock signal CLK33 to the clock level shifter circuitry 204 and the second clock driver circuitry 214. The second clock driver circuitry 214, which also may be enabled, may generate the second clock signal CLK18 in the low operating voltage domain and send the second clock signal CLK18 to the clock buffer 210.

As described in further detail below, the second multiplexer 212 may be configured to use the second clock signal CLK18 as its selection signal. In one example configuration, however, the second multiplexer 212 may use the second clock signal CLK18 as a pair of complementary signals in order to operate. Accordingly, based on the clock signal CLK18, the clock buffer 210 may generate a pair of complementary clock signals CLK18_n, CLK18_b. The clock signal CLK18_n may directly aligned with the clock signal CLK18, while the other clock signal CLK18_b may be inversely aligned with the clock signal CLK18_n. The clock buffer 210 may be configured to minimize skew between the complementary clock signals CLK18_n, CLK18_b. The second multiplexer 212 may receive the complementary clock signals CLK18_n, CLK18_b and use them as selection signals to generate the directly aligned data signals ngate18, pgate18, which may be sent to the hybrid output driver circuitry 224 to generate the data signal DAT, as described in further detail below.

With reference to the second data path, when the host interface 112 is in the low operating voltage mode, a pair of data signals I0, I1 may be generated by the core logic circuitry 106 and output to the second data path for generation of the data signal DAT by the hybrid output driver circuitry 224. The data signals I0, I1 may be phase-shifted versions of each other. As shown in FIG. 5, the data signals I0, I1 may be phase-shifted 90 degrees relative to each other. Also, the data signals I0, I1 may be phase-shifted 180-degrees relative to each other with reference to the second clock signal CLK18. As shown in FIG. 5, the data signals I0, I1 may perform rising transitions during different halves of a cycle of the second clock signal CLK18. For example, the data signal I1 may perform its rising transition during a first half of a clock cycle of the second clock signal CLK18 (e.g., while the second clock signal CLK18 is high), and the data signal I0 may then perform its rising transition during a second half of the cycle of the second clock signal CLK18 (e.g., while the second clock signal CLK18 is low). Similarly, the data signals I0, I1 may perform falling transitions during different halves of a cycle of the second clock signal CLK18. For example, the data signal I1 may perform its falling transition during a first half of a clock cycle of the second clock signal CLK18 and the data signal I0 may then perform its falling transition during a second half of the cycle of the second clock signal CLK18. In this sense, the data signals I0, I1 may be considered 180-degree phase shifted signals relative to each other with reference to the second clock signal CLK18. Also, FIG. 5 shows data signal I0 leading data signal I1, although in other configurations, data signal I1 may lead data signal I0.

Also, similar to the data signal I2, the data signals I0, I1 may be generated by the core logic circuitry 106 and may include data that the core logic circuitry 106 has internally generated, stored, retrieved from another component of the clock-receiving system 104, from a component external the clock-receiving system 104, or some combination thereof. Also, the data signals I0, I1 may be generated using previous cycles of the first clock signal CLK12 that is sent to the core logic circuitry 106. However, the data signal DAT that is ultimately generated based on the data signals I0, I1 is generated using the second clock signal CLK18. To do so, the data signals I0, I1 may be generated and output by the core logic circuitry 106 so that As shown in FIG. 2, the data signals I0, I1 may be sent to the first multiplexer 218, and in response, the first multiplexer 218 may generate a pair of data signals dn_i0, dp_i0 based on the data signal I0 and a pair of data signals dn_i1, dp_i1 based on the data signal I1 in the core voltage domain. As shown in FIG. 5, the pairs of data signals dn_i0, dp_i0 may be directly aligned with each other and with the data signal IO, and the data signals dn_i1. dp_i1 may be directly aligned with each other and with the data signal I1. Also, the phase shift may be maintained such that and the two pairs of data signals dn_i0, dp_0 and dn_i1, dp_i1 may be phase-shifted 90-degrees relative to each other and 180-degrees relative to each other with reference to the second clock signal CLK18.

The second level shifter circuitry 226 may receive the two pairs of data signals dn_i0, dp_i0 and dn_i1, dp_i1 and based on these signals, generate two pairs of data signals dn18_i0, dp18_i0 and dn18_i1, dp18_i1 in the low operating voltage domain. As shown in FIG. 5, the data signals dn18_i0, dp18_i0 may be directly aligned with each other and also with data signals dn_i0, dp_i0. Likewise, the data signals dn18_i1, dp18_i1 may be directly aligned with each other and also with data signals dn_i1, dp_i1. In addition, as shown in FIG. 5, the phase shift may be maintained, and the two pairs of data signals dn18_i0, dp18_0 and dn18_i1, dp18_i1 may be phase-shifted 90-degrees relative to each other and 180-degrees relative to each other with reference to the second clock signal CLK18. Further, the second level shifter circuitry 226 may receive the core voltage VDD and the reference voltage REF, and be configured to convert the two pairs of data signals dn_i0, dp_i0 and dn_i1, dp_i1 in the core voltage domain to the two pairs of data signals dn18_i0, dp18_i0 and dn18_i1, dp18_i1 in the low operating voltage domain.

Figure 6:
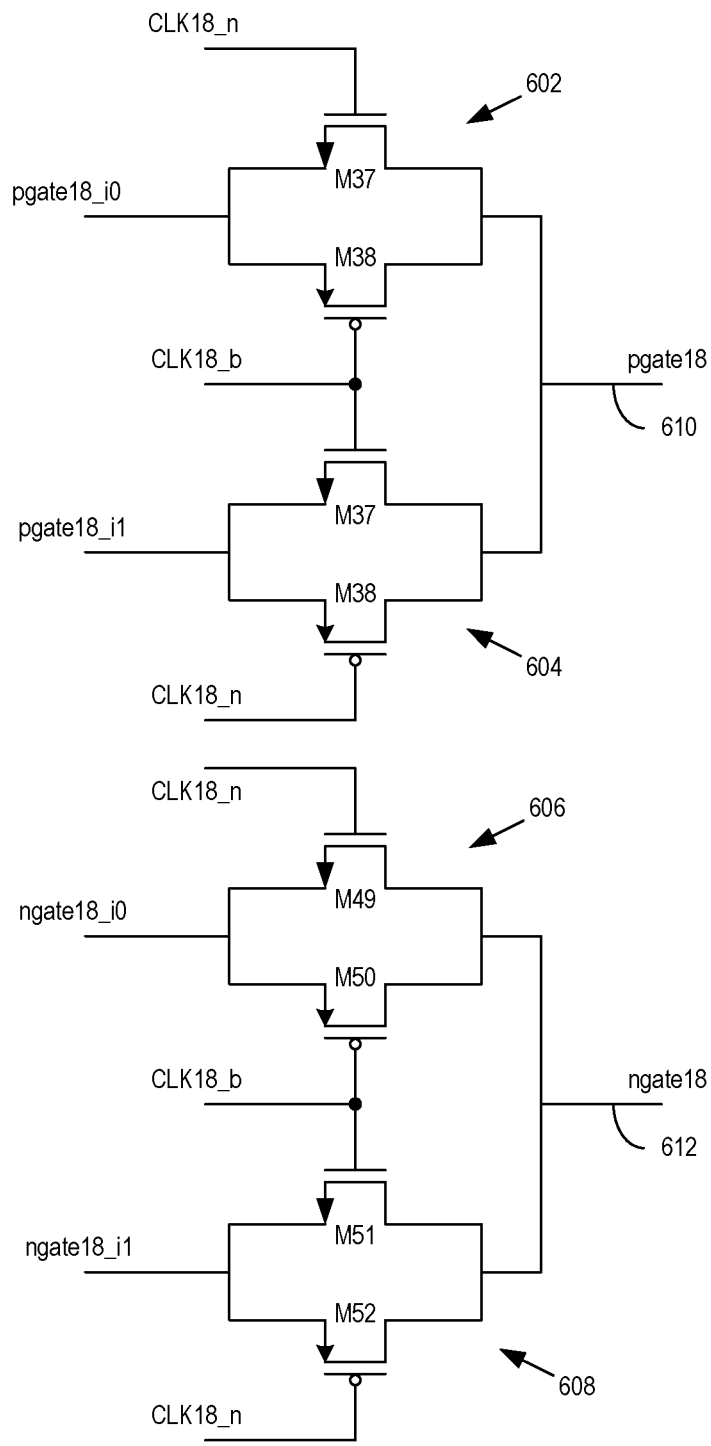
FIG. 6 is a circuit schematic of an example circuit configuration of a second multiplexer of FIG. 2.

The second pre-driver circuitry 228 may receive the two pairs of data signals dn18_i0, dp18_i0 and dn18_i1, dp18_i1 from the second level shifter circuitry 226, and in response, generate corresponding pairs of data signals ngate18_i0, pgate18_i0 and ngate18_i1, pgate18_i1. As shown in FIG. 6, the pair of data signals ngate18_i0, pgate18_i0 may be directly aligned with each other, and inversely aligned with data signals dn18_i0, dp18_i0. In addition, the pair of data signals ngate18_i1, pgate18_i1 may be directly aligned with each other, and inversely aligned with the data signals dn18_i1, dp18_i1. Also, the phase shift may be maintained, and the two pairs of data signals ngate18_i0, pgate18_i0 and ngate18_i1, pgate18_i1 may be phase-shifted 90-degrees relative to each other and 180-degrees with reference to the second clock signal CLK18.

In addition, as shown in FIG. 2, the second pre-driver circuitry 228 may receive the reference voltage REF and the IO voltage VDDO. As explained in further detail below, the data signals pgate18_i0, pgate18_i1 may be used to turn on and off a PMOS transistor of the hybrid output driver circuitry 224, and the data signals ngate18_i0, ngate18_i1 may be used to turn on and off an NMOS transistor of the hybrid output driver circuitry 224. The PMOS transistor may be turned off by applying a gate voltage at the level of the IO voltage VDDO. Since the reference voltage REF is at the low operating voltage level regardless of the operating mode, the reference voltage REF may not be a high enough level to turn off the PMOS transistor when the host interface is in the high operating voltage mode. As such, the IO voltage VDDO may be supplied to the second pre-driver circuitry 228 in order to set pgate18_i0 and pgate18_i1 to the level of the IO voltage VDDO so that the PMOS transistor may turn off when the host interface 112 is in the high operating voltage mode.

However, as described in further detail below, the transistors of the second pre-driver circuitry 228 may be optimized for delay for the low operating voltage mode, which may cause too high of drain-to-source voltage stress on the transistors if proper precaution in the transistor configuration is not taken. One way to take proper precaution may be to avoid applying the high operating voltage to the transistors where possible. Since 0 V rather than the high operating voltage may be used to turn off the NMOS transistor of the hybrid output driver circuitry 224 in the high operating voltage mode, the reference voltage REF may be used to generate ngate18_i0 and ngate18_i1. Accordingly, as shown in FIG. 5, the data signals pgate18_i0 and pgate18_i1 may transition between the level of the IO voltage VDDO and 0 V, whereas the data signals ngate18_i0 and ngate18_i1 may transition between the level of the reference voltage REF and 0 V. In the low operating voltage mode however, the levels of the IO voltage VDDO and the reference voltage REF may be the same. Further description of transistor optimization for the low operating voltage mode and use of both the IO voltage VDDO and the reference voltage REF for the second pre-driver circuitry 228 is provided in further detail below.

The second multiplexer 212 may receive the pairs of data signals ngate18_i0, pgate18_i0 and ngate18_i1, pgate18_i1 from the second pre-driver circuitry 228. Based on these signals, the second multiplexer 212 may generate a pair of data signals ngate18, pgate18, which are sent to the hybrid output driver circuitry 224 for generation of the data signal DAT. As shown in FIG. 5, the data signals ngate18, pgate18 are directly aligned with each other.

The second multiplexer 212 may also receive the complementary clock signals CLK18_n, CLK18_b and use them as selection signals to select whether to set the levels of the data signals ngate18, pgate18 being output by the second multiplexer 212 to the levels of the data signals ngate18_i0, pgate18_i0 corresponding to the data signal I0 (i.e., pass the data signals ngate18_i0, pgate18_i0 to the output terminals of the second multiplexer 212), or to set the levels of the data signals ngate18, pgate18 to the levels of the data signals ngate18 pgate18_i1 corresponding to the data signal I1. In other words, the second multiplexer may use the complementary clock signals CLK18_n, CLK18_b as selection signals in order to select either to pass the data signals ngate18_i0, pgate18_i0 corresponding to the data signal I0 or to pass the data signals data signals ngate18_i1, pgate18_i1 corresponding to the data signal I1 to the output terminals of the second multiplexer 212.

In a particular example configuration as shown in the timing diagram of FIG. 5, when the second clock signal CLK18 (and the clock signal CLK18_n) is high, the second multiplexer 212 is configured to set the levels of the data signals ngate18, pgate18 to the levels of the data signals ngate18_i0, pgate18_i0 corresponding to data signal TO, and when the second clock signal CLK18 (and the clock signal CLK18_n) is low, set the levels of the data signals ngate18, pgate18 to the levels of the data signals ngate18_i1, pgate18_i1 corresponding to the data signal l1. To ensure stability under this particular configuration, the rates and relative phases of the data and clock signals input to the second multiplexer 212 may be such that within a clock cycle of the clock signal CLK18_n, during a first half cycle or time that the clock signal CLK18_n is high, the data signals ngate18_i0, pgate18_i0 corresponding to the data signal I0 maintain constant levels (i.e., they are not transitioning from high to low or vice versa), and during a second half cycle or time that the clock signal CLK18_n is low, the data signals ngate18_i1, pgate18_i1 corresponding to the data signal I1 maintain constant levels (i.e., they are not transitioning from high to low or vice versa). Also, during the first half cycle that the clock signal CLK18_n is high, the data signals ngate18_i1, pgate18_i1 corresponding to the data signal I1 may transition, and their transitions may not affect the levels of the data signal ngate18, pgate18 at the output of the second multiplexer 212. Similarly, during the second half cycle that the clock signal CLK18_n is low, the data signals ngate18_i0, pgate18_i0 corresponding to the data signal I0 may transition, and their transitions may not affect the levels of the data signal ngate18, pgate18 at the output of the second multiplexer 212.

As shown in FIG. 5, the rate of the clock signals (i.e., CLK18, CLK18_n, CLK18_b) may be twice the rate of the data signals. In this sense, the second multiplexer 212 is operating in a double data rate (DDR) fashion, since it is operating to pass the levels of its inputs data signals to its output terminals on both the rising edge and the falling edge of the clock signals CLK_n, CLK_b. However, because the input data signals ngate18_i0, pgate18_i1 and ngate18_i1, pgate18_i1 are phased-shifted 180 degrees with reference to the second clock signal CLK18, then over a clock cycle, the associated I0 data signals (i.e., data signals ngate_i0, pgate_i0) for one half of the clock cycle may be at the same level as the associated I1 data signals (i.e., data signals ngate_i1, pgate_i1) for the other half of the clock cycle. For example, in FIG. 5, suppose during a first half of the clock cycle, the clock signal CLK_n is low, and during a second half of the clock cycle, the clock signal CLK_n is high. Due to the 180-degree phase shift between the associated I0 and I1 data signals, if the I1 data signals are low during the first half of the clock cycle, then the I0 data signals are low during the second half of the clock cycle. Similarly, if the I1 data signals are high during the first half of the clock cycle, then the I0 data signals are high during the second half of the clock cycle. Since the second multiplexer 212 operates to output the I1 data signals when the clock signal CLK_n is low and to output the I0 data signals when the clock signal CLK_n is high, then the rate of the output data signals ngate18, pgate18 may be the same as the rate of the other data signals (half the rate of the clock signals), despite the despite the DDR operation of the second multiplexer 212.

FIG. 6 shows a circuit schematic diagram of an example circuit configuration of the second multiplexer 212. The example circuit configuration may include four pass gates 602, 604, 606, 608. Each of the pass gates 602-608 may include a NMOS transistor and a PMOS transistor, an input configured to receive one of the data signals ngate18_i0, pgate18_i0, ngate18_i1, pgate18_i1, and an output connected to one of two output terminals of the second multiplexer 212, including a first output terminal 610 and a second output terminal 612. For each of the pass gates 602-808, source terminals of each of the NMOS and PMOS transistors may be connected to the input of the pass gate, and drain terminals of each of the NMOS and PMOS transistors may be connected to the output of the pass gate. The gate terminal of the NMOS transistor may configured to receive one of the clock signal CLK_n and the inverse clock signal CLK_b, and the gate terminal of the PMOS transistor may be configured to receive the other of the clock signal CLK_n and the inverse clock signal CLK_b.

In addition, in the example circuit configuration of FIG. 6, two of the four pass gates 202-208 may have outputs connected to the first output terminal 610, and the other two pass gates may have outputs connected to the second output terminal 612. One of the two pass gates may be configured to receive an I0 data signal and the other of the two pass gates may be configured to receive an I1 data signal. For example, as shown in FIG. 6, the first pass gate 602 configured to receive the data signal pgate18_i0 and the second pass gate 604 configured to receive the data signal pgate18_i1 may have their respective outputs connected to the first output terminal 610, and the third pass gate 606 configured to receive the data signal ngate18_i0 and the fourth pass gate 608 configured to receive the data signal ngate18_i1 may have their respective outputs connected to the second output terminal 612.

Addition, for the two pass gates having their outputs connected together, one of the pass gates may have its NMOS transistor configured to receive the clock signal CLK18_n and its PMOS transistor configured to receive the inverse clock signal CLK_b, while the other pass gate may have its NMOS transistor configured to receive the inverse clock signal CLK_b and its PMOS transistor configured to receive the clock signal CLK_n. For example, in the example circuit configuration of FIG. 6, the first pass gate 602 may include a NMOS transistor M37 having a gate terminal configured to receive the clock signal CLK_n and a PMOS transistor M38 having a gate terminal configured to receive the inverse clock signal CLK_b, and the second pass gate 604 may include a NMOS transistor M39 configured to receive the inverse clock signal CLK_b and a PMOS transistor M40 having a gate terminal configured to receive the clock signal CLK_n. In addition, the third pass gate 606 may include a NMOS transistor M49 having a gate terminal configured to receive the clock signal CLK_n and a PMOS transistor M50 having a gate terminal configured to receive the inverse clock signal CLK_b, and the fourth pass gate 608 may include a NMOS transistor M51 configured to receive the inverse clock signal CLK_b and a PMOS transistor M52 having a gate terminal configured to receive the clock signal CLK_n.

In operation, when the clock signal CLK_n is high and the inverse clock signal CLK_b is low, the data signal pgate18_i0 may be passed to the first output terminal 610 and the data signal ngate18_i0 may be passed to the second output terminal 612. That is, when the clock signal CLK_n is high and the inverse clock signal CLK_b is low, the level of the data signal pgate18 generated at the first output terminal 610 may be set to the level of the data signal pgate18_i0 and the level of the data signal ngate18 generated at the second output terminal 612 may be set to the level of the data signal ngate18_i0. In addition, when the clock signal CLK_n is low and the inverse clock signal CLK_b is high, the data signal pgate18_i1 may be passed to the first output terminal 610 and the data signal ngate18_i1 may be passed to the second output terminal 612. That is, when the clock signal CLK_n is low and the inverse clock signal CLK_b is high, the level of the data signal pgate18 generated at the first output terminal 610 may be set to the level of the data signal pgate18_i1 and the level of the data signal ngate18 generated at the second output terminal 612 may be set to the level of the data signal ngate18_i1.

Referring back to FIG. 2, as previously described, generating the data signal DAT using the second critical path and the second clock signal CLK 18 may provide a shorter loop delay compared to generating the data signal DAT using the first critical path and the first clock signal CLK12. This may be achieved because the second multiplexer 212 is configured directly behind the hybrid output driver circuitry 224 (i.e., the output of the multiplexer 212 is connected directly to the input of the hybrid output circuitry 224). When the second multiplexer 212 generates the data signal gate18 using the clock signals CLK18_n, CLK18_b, the data signal gate18 may be output directly to the hybrid output driver circuitry 224 for generation of the data signal DAT. In other words, when the data signal gate18 is generated by the second multiplexer 212, the circuit components of the second data path (including the first multiplexer 218, the second level shifter circuitry 226, and the second pre-driver circuitry 228) are not thereafter used in order for the data signal DAT to be generated with the hybrid output driver circuitry 224. In contrast, when the core logic circuitry 106 generates the data signal I2 with the first clock signal CLK12, the circuit components of the first data path (including the first multiplexer 218, the first level shifter circuitry 220, and the first pre-driver circuitry 222) are thereafter used to convert the data signal I2 to data signals ngate33, pgate33 in order for the data signal DAT to be generated with the hybrid output driver circuitry 224.

In order to take advantage of the shortened loop delay provided by the second critical path, the initial cycles of the data signals ngate18_i0, pgate18_i0 (which lead the data signals ngate18_i1, pgate18_i1) may be received by the second multiplexer 212 (i.e., the data signals I0, I1 may be made available to the second multiplexer 212) at least one half cycle of the second clock signal CLK18 before the initial cycles of the clock signals CLK18_n, CLK_b arrive at the second multiplexer 212. In order for this to happen, the core logic circuitry 106 may already have the data for sending back to the clock-sending system 102 before the clock-receiving system 104 receives the host clock signal $CLK_{HOST}$ (or at least the portion of the host clock signal $CLK_{HOST}$ that is to be used to communicate the data back to the clock-sending system 102). In addition, even if the second critical path is enabled and used to generate the data signal DAT, the first clock signal CLK12 is still generated and sent to the core logic circuitry 106 for generation of the data signals I0, I1. This is shown in FIG. 2, with the second Schmitt trigger 208 being configured to output the clock signal CLK33 to both the second clock driver circuitry 214 of the second critical path and the clock level shifter circuitry 204 of the first critical path. The core logic circuitry 106 may use the first clock signal CLK12 to generate the data signals I0, I1, and may do so a sufficient amount of time in advance of the generation of the data signal DAT such that the initial cycles of the data signals ngate18_i0, pgate18_i0 (which lead the data signals ngate18_i1, pgate18_i1) are received by the second multiplexer 212 at least one half cycle before the initial cycles of the clock signals CLK18_n, CLK18_b (or at least initial cycles of those portions of the clock signals CLK18_n, CLK_b used to communicate the data back to the clock-sending system 102) are received by the second multiplexer 212.

The hybrid output driver circuitry 224 may referred to as a "hybrid" in that it includes two circuit portions, a first circuit portion that generates the data signal DAT on the data line 118[j] when the host interface 112 is operating in the high operating voltage mode and a second circuit portion that generates the data signal DAT on the data line 118[j] when the host interface 112 is operating in the low operating voltage mode. In the high operating voltage mode, the first circuit portion may be enabled or activated to generate the data signal DAT, while the second circuit portion may be disabled or deactivated. On the other hand, in the low operating voltage mode, the second circuit portion may be enabled or activated to generate the data signal DAT, while the first circuit portion may be disabled or deactivated.

Figure 7:
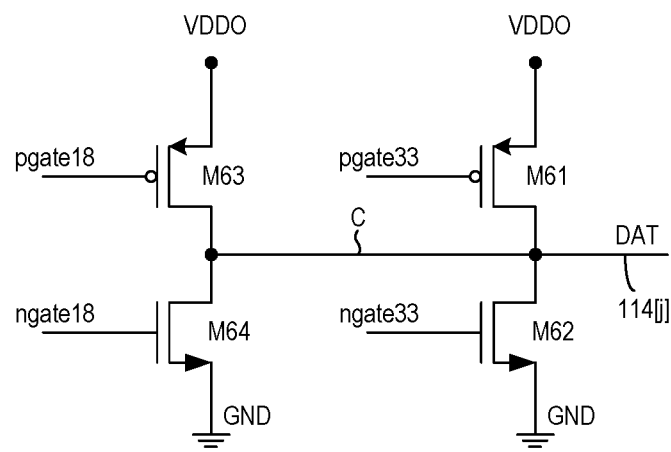
FIG. 7 is a circuit schematic of an example circuit configuration of hybrid output driver circuitry of FIG. 2.

FIG. 7 shows a circuit schematic diagram of an example circuit configuration for the hybrid output driver circuitry 224. In the example circuit configuration shown in FIG. 7, each of the first and second circuit portions may be configured in pull-up/pull-down configurations when activated. That is, when each are activated, in order to generate the data signal DAT, the first and second circuit portions may pull up the level of the data signal DAT to the level of the IO voltage and pull down the level of the data signal DAT to a low level, such as ground.

The first circuit portion may include a first PMOS transistor M61 and a first NMOS transistor M62. The first PMOS transistor M61 may have a source terminal configured to receive the IO voltage VDDO, a gate terminal configured to receive the data signal pgate33, and a drain terminal coupled to a node C connected to the data line 114[j] where the data signal DAT is generated. The first NMOS transistor M62 may have a source terminal connected to the ground reference voltage GND, a gate terminal configured to receive the data signal ngate33, and a drain terminal coupled to node C. As previously described, data signals pgate33, ngate33 may be directly aligned with each other. When the data signals ngate33, pgate33 are at their high levels, the first PMOS transistor M61 is turned off and the first NMOS transistor M62 may be turned on, pulling down the voltage level of the data signal DAT to ground GND. Alternatively, when the data signals ngate33, pgate33 are at their low levels, the first PMOS transistor M61 may be turned on and the first NMOS transistor M62 may be turned off, pulling up the voltage level of the data signal DAT to the level of the IO voltage VDDO.

Similarly, the second circuit portion may include a second PMOS transistor M63 and a second NMOS transistor M64. The second PMOS transistor M63 may have a source terminal configured to receive the IO voltage VDDO, a gate terminal connected to receive the data signal pgate18, and a drain terminal coupled to node C. The second NMOS transistor M63 may have a source terminal connected to the ground reference voltage GND, a gate terminal configured to receive the data signal ngate18, and a drain terminal coupled to node C. As previously described, data signals pgate18, ngate18 may be directly aligned with each other. When the data signals ngate18, pgate18 are at their high levels, the second PMOS transistor M63 may be turned off and the second NMOS transistor M64 may be turned on, pulling down the voltage level of the data signal DAT to ground GND. Alternatively, when the data signals ngate18, pgate18 are at their low levels, the second PMOS transistor M63 may be turned on and the second NMOS transistor M64 may be turned off, pulling up the voltage level of the data signal DAT to the level of the IO voltage VDDO.

As previously described, when the first circuit portion is activated the second circuit portion may be deactivated, and vice versa. Accordingly, in the high operating voltage mode when the first transistors M61, M62 are pulling up and down the level on node C to generate the data signal DAT, the lines that supply the data signals pgate18, ngate18 to the gate terminals of the second transistors M63, M64 may be set to voltage levels that turn off the second transistors M63, M64. For example, data signal pgate18 may be set to the IO voltage level VDDO to turn off the second PMOS transistor M63 and data signal ngate18 may be set to the ground reference voltage GND (e.g., 0 V) to turn off the second NMOS transistor M64. In this way, when the host interface 112 is in the high operating voltage mode, only first transistors M61, M62 are being used to generate the data signal DAT on the data line 114[j]. Similarly, in the low operating voltage mode when the second transistors M63, M64 are pulling up and down the level on node C to generate the data signal DAT, the lines that supply the data signals pgate33, ngate33 to the gate terminals of the first transistors M61, M62 may be set to voltage levels that turn off the first transistors M61, M62. For example, data signal pgate33 may be set to the IO voltage level VDDO to turn off the first PMOS transistor M61 and data signal ngate33 may be set to the ground reference voltage GND (e.g., 0 V) to turn off the first NMOS transistor M62. In this way, when the host interface 108 is in the low operating voltage mode, only second transistors M63, M64 are being used to generate the data signal DAT on the data line 114[j].

Referring back to FIG. 2, when the host interface 108 is in the high operating voltage mode, the first multiplexer 218 may be configured to set and maintain appropriate voltage levels for the data signals dn_i0, dp_i0, and dn_i1, dp_i1 in order to keep the second portion of the hybrid output driver circuitry 224 deactivated while the host interface 108 is in the high operating voltage mode. Additionally, the second clock driver circuitry 214, being disabled, may be configured to set and maintain the level of the clock signal CLK18, and in turn the clock buffer 210 may be configured to set and maintain the levels of the complimentary clock signals CLK18_n, CLK18_b to appropriate levels, so that upon receipt of the data signals ngate18_i0, pgate18_i0, ngate18_i1, pgate18_i1 and the complimentary clock signals CLK18_n, CLK18, the second multiplexer 212 sets and maintains the data signals ngate18, pgate18 at levels that deactivate the second portion of the hybrid output driver circuitry 224.

Referring back to FIG. 4, in the high operating voltage mode, the second clock driver circuitry 214 may set and maintain the clock signal CLK18 at the reference voltage level REF, and in turn the clock buffer 210 may set and maintain the complimentary clock signals CLK18_n, CLK_b at the reference voltage level REF and 0 V (i.e., the low voltage) respectively. Using the example circuit configuration of the second multiplexer 212 of FIG. 6, with the clock signals CLK_n, CLKb set to their respective levels, the level of pgate18 at the first output terminal 610 and the level of the ngate18 at the second output terminal 612 may be set to levels of the I0 signals pgate18_i0, ngate18_i0. As shown in FIG. 4, so that the voltages of pgate18 at the first output terminal 610 and the voltage of ngate18 at the second output terminal 612 deactivate (i.e., turn off) the second PMOS transistor M63 and the second NMOS transistor M64 of the hybrid output driver circuitry 224 (FIG. 7), respectively, the voltage of pgate18 may be set to the IO voltage VDDO and the voltage of ngate18 may be set to 0 V. In order to have these voltages set accordingly, the first multiplexer 218 may set to and maintain dn_i0 and dn_i1 at the high voltage level in the core voltage domain (i.e., the core voltage VDD) and dp_i0 and dp_i1 at the low voltage level in the core voltage domain (i.e., 0 V). In response, the second level shifter circuitry 226 may set to and maintain dn18_i0 and dn18_i1 at the reference voltage level REF, and dp18_i0 and dp18_i1 at 0 V. As previously described, the second pre-driver circuitry 228 may invert the levels of its inputs. Accordingly, the second pre-driver circuitry 228 may pull down dn_i0 and dn_i1 to generate ngate18_i0 and ngate18_i1, respectively, and may pull up dp_i0 and dp_i1 to generate pgate18_i0 and pgate18_i1, respectively. In addition, when generated, pgate18_i0 and pgate18_i1 may be pulled up to the level of the IO voltage VDDO rather than the level of the reference voltage REF so that second PMOS transistor M63 of the hybrid output driver circuitry 224 may be turned off in the high operating voltage mode.

In a similar manner, when the host interface 112 is in the low operating voltage mode, the first multiplexer 218 may be configured to set and maintain appropriate voltage levels for the data signals dn_i2, dp_i2 in order to keep the first circuit portion of the hybrid output driver circuitry 224 deactivated. As shown in FIG. 5, the first multiplexer 218 may be configured to set and maintain dn_i2 at the core voltage level VDD and dp_i2 at 0 V. In turn, the first level shifter circuitry 220 may set and maintain dn33 at the level of the IO voltage VDDO (which is here the low operating voltage level), and dp33 at 0 V. In response, the first pre-driver circuitry 222 may be configured to set and maintain ngate33 at 0 V and pgate33 at the level of the IO voltage level VDDO (which is here the low operating voltage level). With pgate33 at the IO voltage level VDDO and ngate33 at 0 V, the first PMOS transistor M61 and the first NMOS transistor M62 of the hybrid output driver circuitry 224 (FIG. 7) may each be deactivated (i.e., turned off).

As shown in FIG. 2, the core logic circuitry 106 may output a data path control signal OE that configures the first multiplexer in either a first state associated with the high operating voltage mode or a second state associated with the low operating voltage mode. When the core logic circuitry 106 determines that the host interface 108 is in the high operating voltage mode, the core logic circuitry 106 may output the data path control signal OE to the first multiplexer 218 such that the first multiplexer 218 is configured in the first state and sets and maintains the appropriate voltage levels for the data signals dn_i0, dp_i0, and dn_i1, dp_i1 in order to keep the second portion of the hybrid output driver circuitry 224 deactivated. Alternatively, when the core logic circuitry 106 determines that the host interface 108 is in the low operating voltage mode, the core logic circuitry 106 may output the data path control signal OE to the first multiplexer 218 such that the first multiplexer 218 is configured in the second state and sets and maintains the appropriate voltage levels for the data signals dn_i2, dp_i2 in order to keep the first circuit portion of the hybrid output driver circuitry 224 deactivated.

The transistors of the first and second data paths may be of the same type in that they may have the same gate widths. In one example configuration, where the high and low operating voltages are 3.3 V and 1.8 V respectively, the gate width may be 55 Angstroms (Å). However, due to capacitive loading, a transistor having a gate length optimized for the high operating voltage mode may provide an increased amount of delay when switching in the low operating voltage mode. That is, a transistor with a certain gate length may have its source terminal configured to receive the IO voltage VDDO. When the IO voltage VDDO is at the high operating voltage level, the transistor may provide a certain delay when turning on and off to drive an output signal to high and low levels. However, due to the capacitive loading at the output, when the IO voltage VDDO is at the low operating voltage level, the delay provided by the transistor when turning on and off to drive the output signal to the high and low levels may increase, such as on the order of 4× for some transistor technologies. In general, reducing the gate length may serve to reduce the delay. However, the drain-to-source breakdown voltage may also be reduced. Depending on the transistor technology used and the voltage levels for the first and second operating voltages, reducing the gate length to optimize for the lower operating voltage level may yield a drain-to-source for at least some of the transistors that is above the breakdown drain-to-source voltage, causing the transistors to experience too high of stress levels and break down.

The gates of both the first PMOS and NMOS transistors M61, M62 of the hybrid output driver circuitry 224 and the second PMOS and NMOS transistors M63, M64 may all have the same gate length, which may be optimized for the high operating voltage level. The gate length optimized for the high operating voltage level may be herein referred to as the longer gate length. To optimize for delay, the gates of the transistors of the first pre-driver circuitry 220 in the first data path may be configured with the longer gate length. However, the gates of the transistors of the second pre-driver circuitry 228 and the second multiplexer 212 in the second data path may have gate lengths optimized for the low operating voltage level. The gate length optimized for the low operating voltage level may be herein referred to as the shorter gate length.

As previously described, in the high operating voltage mode, the second pre-driver circuitry 228 may output pgate18_i0 and pgate18_i1 at the high operating voltage level in order to have the second PMOS M63 of the hybrid output driver circuitry 224 turned off. As such, at least some of the PMOS transistors of the second pre-driver circuitry 228 may have source terminals configured to receive the IO voltage VDDO in order to generate pgate18_i0 and pgate18_i1 at the high operating voltage level. In order to prevent the transistors of the second pre-driver circuitry 228 having the shorter gate lengths from breaking down, the reference voltage REF may be used to reduce the stress.

Figure 8:
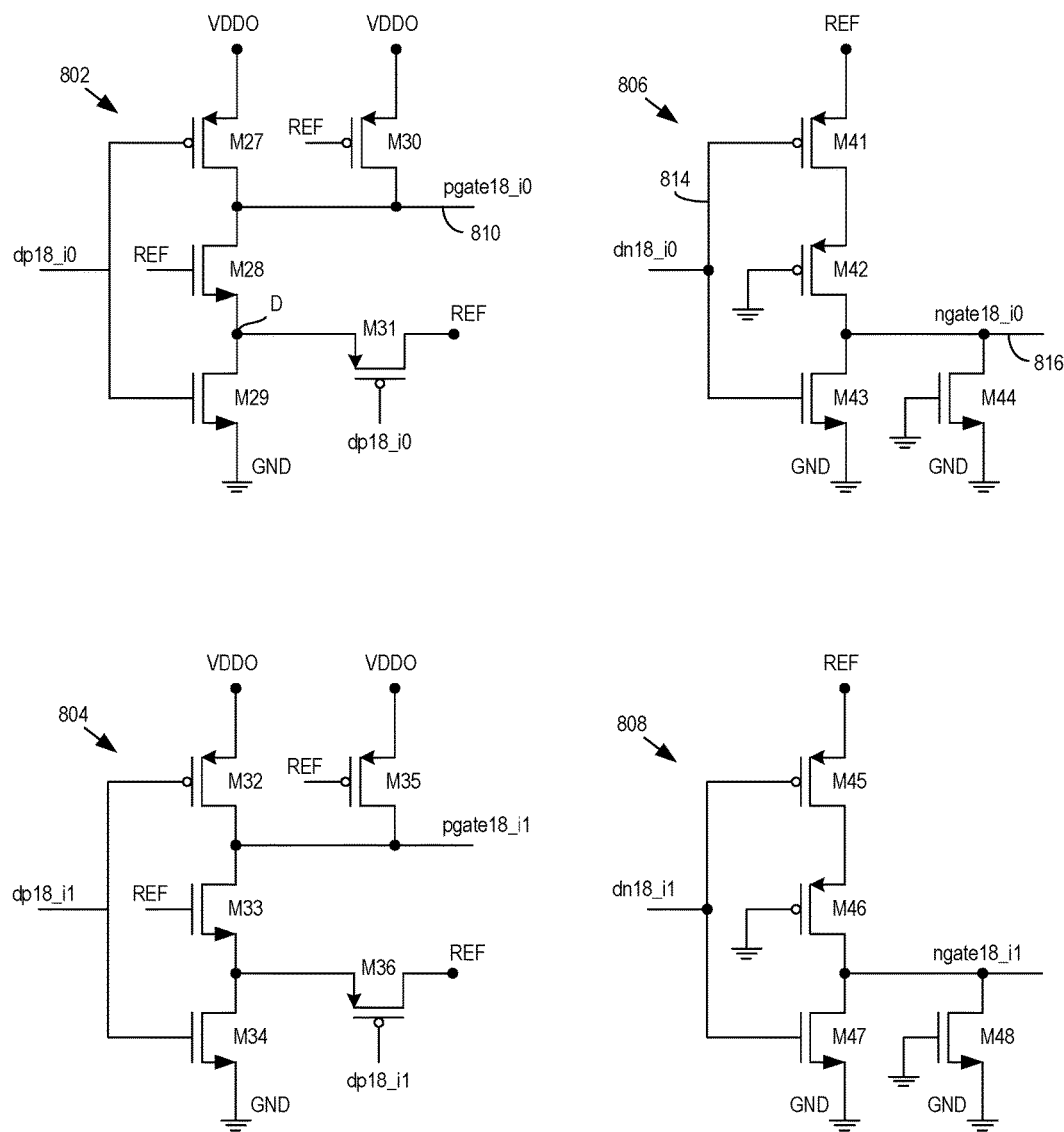
FIG. 8 is a circuit schematic of an example circuit configuration of second pre-driver circuitry of FIG. 2.

FIG. 8 shows a circuit schematic diagram of an example circuit configuration of the second pre-driver circuitry 228. The example circuit configuration may include four pre-driver circuits, including a first pre-driver circuit 802, a second pre-driver circuit 804, a third pre-driver circuit 806, and a fourth pre-driver circuit 808. The first pre-driver circuit 802 may be configured to receive dp18_i0 and output pgate18_i0; the second pre-driver circuit 804 may be configured to receive dp18_i1 and output pgate18_i1; the third pre-driver circuit 806 may be configured to receive dn18_i0 and output ngate18_i0; and the fourth pre-driver circuit 808 may be configured to receive dn18_i1 and output ngate18_i1.

The first pre-driver circuit 802 may include a first transistor circuitry including first PMOS transistor M27 and a second PMOS transistor M30, second transistor circuitry including a first NMOS transistor M28 and a second NMOS transistor M29, and third transistor circuitry including a third PMOS transistor M31. The second pre-driver circuit 804 may include a first PMOS transistor M32, a second PMOS transistor M35, a first NMOS transistor M33, a second NMOS transistor M34, and a third PMOS transistor M36. As shown in FIG. 8, the transistors of the first and second pre-driver circuits 802, 804 may have the same circuit configuration. Accordingly, for simplicity, the transistor configuration and operation of the first and second pre-driver circuits 802, 804 is made only with reference to the first pre-driver circuit 802 but is equally applicable to the second pre-driver circuit 804.

As previously described, pgate18_i0 generated at an output terminal 810 may be pulled up to the level of the IO voltage VDDO rather than the level of the reference voltage REF in order to turn off the second PMOS transistor M63 (FIG. 7) of the hybrid output driver circuitry 224. As such, as shown in FIG. 8, the first and second PMOS transistors M27, M30 may each have their source terminals configured to receive the IO voltage VDDO. In addition, the first PMOS transistor M27 have its drain terminal connected to an output node of the output terminal 810 and its gate terminal connected to an input 812 of the first pre-driver circuit to receive the data signal dp18_i0. The second PMOS transistor M30 may have its drain terminal connected to the output terminal 810 and its gate terminal connected to the reference voltage REF. The first NMOS transistor M28 may have its drain terminal connected to the output node of the output terminal 810, its source terminal connected to an internal node of the second transistor circuitry, node D, and its gate terminal connected to the reference voltage REF. The second PMOS transistor M29 may have its drain terminal connected to node D, its source terminal connected to ground, and its gate terminal connected to the input terminal 812. The third PMOS transistor M31 may have its drain terminal connected to the reference voltage REF, its source terminal connected to node D, and its gate terminal also connected to the input terminal 812 and configured to receive the data signal dp18_i0.

In the low operating voltage mode, both the level of the IO voltage VDDO and the level of the reference voltage REF may be at the low operating voltage level. Also during operation, the data signal dp18_i0 may transition between the level of the reference voltage REF (its high level) and 0 V (its low level). When the data signal dp18_i0 is high, the first PMOS transistor M27 may be turned off. The second PMOS transistor M30 may also be off. The second NMOS transistor M29 may be turned on, pulling the voltage at node D down to ground. The first NMOS transistor M28 may be turned on and the third PMOS transistor M31 may be turned off. As a result the level of the data signal pgate18_i0 generated at the output level may be pulled down to 0 V.

Alternatively, when the data signal dp18_i0 is low, the first PMOS transistor M27 may be turned on, pulling up pgate18_i0 at the output terminal 810 to the level of the IO voltage VDDO. The second PMOS transistor M30 may be off. Additionally, the second NMOS transistor M29 may be turned off. The first NMOS transistor M28 may be turned off, and may further cause the voltage at node D to be about the level of the reference voltage REF less a threshold voltage of the first NMOS transistor M28. With the data signal dp18_i0 being low, the reference voltage REF on the drain of the third PMOS transistor M31 may cause the voltage at node D to increase to a level above where the level would be if the third PMOS transistor M31 was not part of the circuit. Although not critical in the low operating voltage mode, this increase in voltage at node D may reduce the drain-to-source voltage across the first NMOS transistor M28, which may prevent breakdown in the high operating voltage mode as described next.

In the high operating voltage mode, the level of the IO voltage VDDO may be at the high operating voltage level and the level of the reference voltage REF may be at the low operating voltage level. Also during operation, the data signal dp18_i0 may be set and maintained at 0 V. The first PMOS transistor M27 may be turned on, pulling up pgate18_i0 at the output terminal 810 to the level of the IO voltage VDDO. Depending on the characteristics of the transistors, the second PMOS transistor M30 may be on or off. The second NMOS transistor M29 may be turned off. As in the low operating voltage mode, the first NMOS transistor M28 may cause the voltage at node D to be the level of the reference voltage REF at its gate terminal less its threshold voltage. If the difference between the level of the IO voltage VDDO and the level of the reference voltage REF is great enough, the source-to-drain voltage across the first NMOS transistor M28, having the shorter gate length, may be above the breakdown voltage. The reference voltage REF being applied to the drain terminal of the third PMOS transistor M31 may increase the voltage level at node D in order to reduce the level of the drain-to-source voltage across the first NMOS transistor M28 from where it would be if the third PMOS transistor M31 was not part of the circuit. The increase of the voltage at node D may be such that the drain-to-source voltage across the first NMOS transistor M28 is at a safe level below the breakdown level. As a result, by including the third PMOS transistor M31 and connecting its drain to the reference voltage VREF, the first pre-driver circuit 802 may be able to safely operate both when the IO voltage is at the low operating voltage level and the high operating voltage level.

The third pre-driver circuit 806 may include a first PMOS transistor M41, a second PMOS transistor M42, a first NMOS transistor M43, and a second NMOS transistor M44. The fourth pre-driver circuit 808 may include a first PMOS transistor M45, a second PMOS transistor M45, a first NMOS transistor M47, and a second NMOS transistor M48. As shown in FIG. 8, the transistors of the third and fourth pre-driver circuits 806, 807 may have the same circuit configuration. Accordingly, for simplicity, the transistor configuration and operation of the third and fourth pre-driver circuits 806, 808 is made only with reference to the third pre-driver circuit 806 but is equally applicable to the fourth pre-driver circuit 808.

The first PMOS transistor M41 may include a source terminal configured to receive the reference voltage REF, a drain terminal connected to a source terminal of the second PMOS transistor M42, and a gate terminal connected to an input terminal 814 of the third pre-driver circuit 806 and configured to receive the data signal dn18_i0. In addition to having its source terminal connected to the drain terminal of the first PMOS transistor M41, the second PMOS transistor M42 may have its gate terminal connected to ground and its drain terminal connected to an output terminal 816 of the third pre-driver circuit 806, where the data signal ngate18_i0 is generated. The first NMOS transistor M43 may include a drain terminal connected to the output terminal 816, a source terminal connected to ground, and a gate terminal connected to the input terminal 814 and configured to receive the data signal dn18_i0. The second NMOS transistor may include a drain terminal connected to the output terminal 816, a source terminal connected to ground, and a gate terminal also connected to ground.

Since the IO voltage VDDO is not applied to the third pre-driver circuit 806, the third pre-driver circuit may operate in the same way in both the high operating voltage mode and the low operating voltage mode, although as previously described, in the low operating voltage mode, the data signal dn18_i0 transitions between the level of the reference voltage REF (its high level) and 0 V (its low level), whereas in the high operating voltage mode, the data signal dn18_i0 is held high at the level of the reference voltage. Further, since the IO voltage VDDO is not applied to the third pre-driver circuit 806, the transistors M41-M44 may be configured with the shorter gate lengths without concern for breakdown.

When the data signal dn18_i0 is high, the first PMOS transistor M41 is turned off and the first NMOS transistor M43 is turned on. The second PMOS transistor M42 and the second PMOS transistor M44 are turned off. As a result, the level of the data signal ngate18_i0 generated at the output terminal 816 is pulled down to ground. Alternatively, when the data signal dn18_i0 is low, the first PMOS transistor M41 is turned on and the first NMOS transistor M43 is turned off. The second PMOS transistor M42 is turned on and the second NMOS transistor M44 is turned off. As a result, the level of the data signal ngate18_i0 is pulled up to the level of the reference voltage REF.

Referring to all four of the pre-driver circuits 802-804, the gate terminals of the second PMOS transistors M30, M35 and the gate terminals of the first NMOS transistors M28, M33 of the first and second pre-driver circuits 802, 804 are shown as receiving the reference voltage REF. Additionally, the gate terminals of the second PMOS transistors M42, M46 and the gate terminals of the second NMOS transistors M44, M48 of the third and fourth pre-driver circuits 806, 808 are shown as being connected to ground. These PMOS and NMOS transistors may be included in their respective circuits to tune or adjust the output impedance of their respective pre-driver circuits 802-808. Adjustment of the output impedance is outside the scope of the present description, and for simplicity, the gate terminals of these transistors are shown as being hardwired to the reference voltage REF and ground accordingly. However, in other applications where adjustment of output impedance is desirable, rather than be hardcoded to the reference voltage REF and ground, the gate terminals may be connected to control voltages that may be set externally, such as by the core logic circuitry 106 (FIGS. 1 and 2), to high or low levels in order to turn on and off these transistors to achieve desired output impedances.

Figure 9:
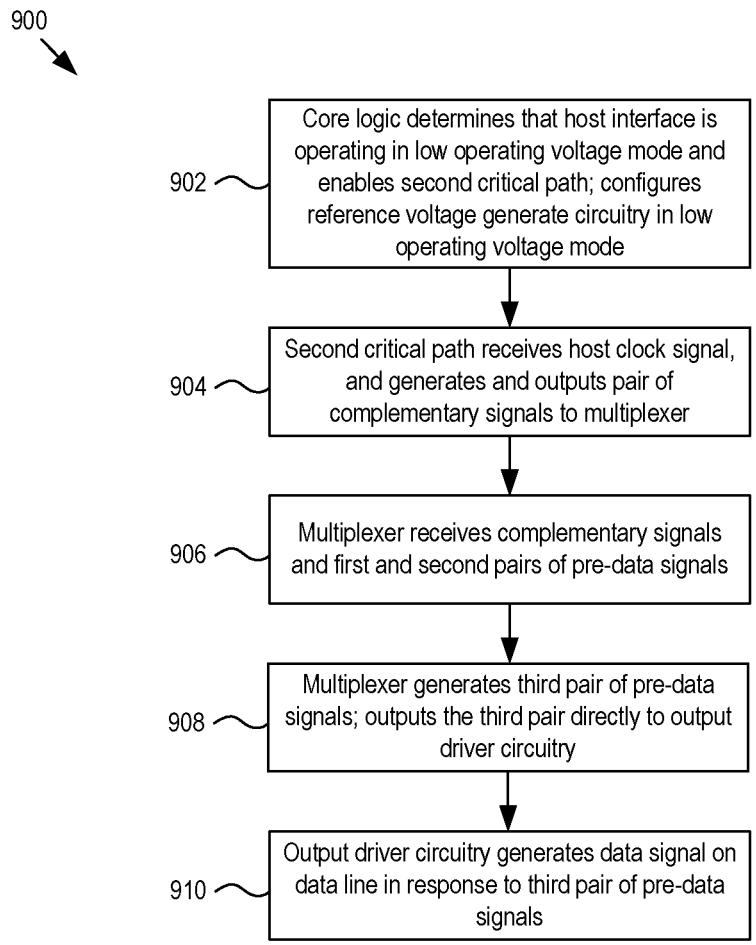
FIG. 9 shows a flow chart of an example method of a clock-receiving system generating a data signal for communication on a data line to a clock-sending system.

FIG. 9 shows a flow chart of an example method 900 of a clock-receiving system generating a data signal for communication on a data line to a clock-sending system. At block 902, core logic circuitry may determine that a host interface of the clock-receiving system is operating in a low operating voltage mode where an IO voltage VDDO is at a low operating voltage level rather than in a high operating voltage mode where the IO voltage VDDO is at a high operating voltage level. In response, the core logic circuitry may enable a second critical path for generation of the data signal. In some example methods, the core logic circuitry may do so by generating and outputting a path enable signal that disables a first Schmitt trigger powered by the IO voltage and enabling a second Schmitt trigger and clock driver circuitry powered by a reference voltage. In addition, at block 902, in order to enable the second critical path, the core logic circuitry may also output the path enable signal to configure reference voltage generation circuitry to generate and output the reference voltage at the low operating voltage level with the IO voltage also being at the low operating voltage level.

At block 904, the second critical path, being enabled, may receive a host clock signal on a host clock line, generate a pair of complementary clock signals based on the host clock signal, and output the pair of complementary signals to a multiplexer. In some example methods, this may include the second Schmitt trigger, being enabled, receiving the host clock signal on a clock line from a clock-sending system. In response, the second Schmitt trigger may generate a first clock signal based on the host clock signal and output the first clock signal to the clock driver circuitry. In response, the clock driver circuitry may generate a second clock signal based on the first clock driver circuitry and output the second clock signal to a clock buffer. In response to receipt of the second clock signal, the clock buffer may generate the pair of complementary signals based on the second clock signal and output the complementary signals to the multiplexer.

At block 906, the multiplexer may receive the pair of complementary signals and two pairs of pre-data signals, including a first pair of pre-data signals and a second pair of pre-data signals. The term pre-data signal may refer to a data signal that includes data to be sent to the clock-sending system and that is generated by the clock-receiving system before and in order for the data signal to be generated and communicated on the clock line. The first pair of pre-data signal may be directly aligned with each other, and the second pair of pre-data signals may be directly aligned with each other. In addition, as previously described, the first pair and second pair of pre-data signals may be phase-shifted relative to each other by 90-degrees relative to each other, or 180-degrees relative to each other with reference to the complementary clock signals. Due to the phase shift, the first pair of pre-data signals may lead the second pair of pre-data signals.

In addition, the rate of the complementary clock signals may be twice the rate of the first and second pairs of pre-data signals. The relative rates and phase shifts of the pair of complementary clock signals and the first and second pairs of pre-data signals may be such that for each of plurality of clock cycles of the clock signals, during a first half of the clock cycle where a first of the clock signals is high and a second of the clock signals is low, the leading first pair of pre-data signals may maintain a constant level while the lagging second pair of pre-data signals may transition their levels (i.e., perform rising transitions or falling transitions), and during a second half of the clock cycle where the first clock signal is low and the second is high, the lagging second pair of pre-data signals may maintain a constant level while the leading first pair of pre-data signals may transition their levels. At block 906, initial cycles of the leading first pair of pre-data signals may be received by the multiplexer at least one half cycle of the complementary clock signals before initial cycles of the complementary clock signals are received by the multiplexer.

At block 908, the multiplexer may generate a third pair of pre-data signals based on receiving the complementary clock signals and the first and second pairs of pre-data signals. In some example methods, generating the third pair of pre-data signals with the multiplexer at block 908 may include: for each cycle of the complementary clock signals, during a first half cycle when the first clock signal is high and the second clock signal is low, setting a voltage on the first and second outputs of the multiplexer to a level that matches a voltage level of the first pair of pre-data signals, and during a second half cycle when the first clock signal is low and the second clock signal is high, setting the voltage on the first and second outputs of the multiplexer to a level that matches a voltage level of the second pair of pre-data signals. Also, at block 908, the multiplexer may output the third pair of pre-data signals directly to output driver circuitry.

At block 910, the output driver circuitry may generate the data signal on the data line in response to the third pair of pre-data signals. In some example methods, to generate the data signal, the output driver circuitry may pull up the voltage to the low operating voltage level in response to the third pair of pre-data signals being at their respective low levels and may pull down the voltage to a low level (e.g., ground or 0V) in response to the third pair of pre-data signals being at their respective high levels.

Figure 10:
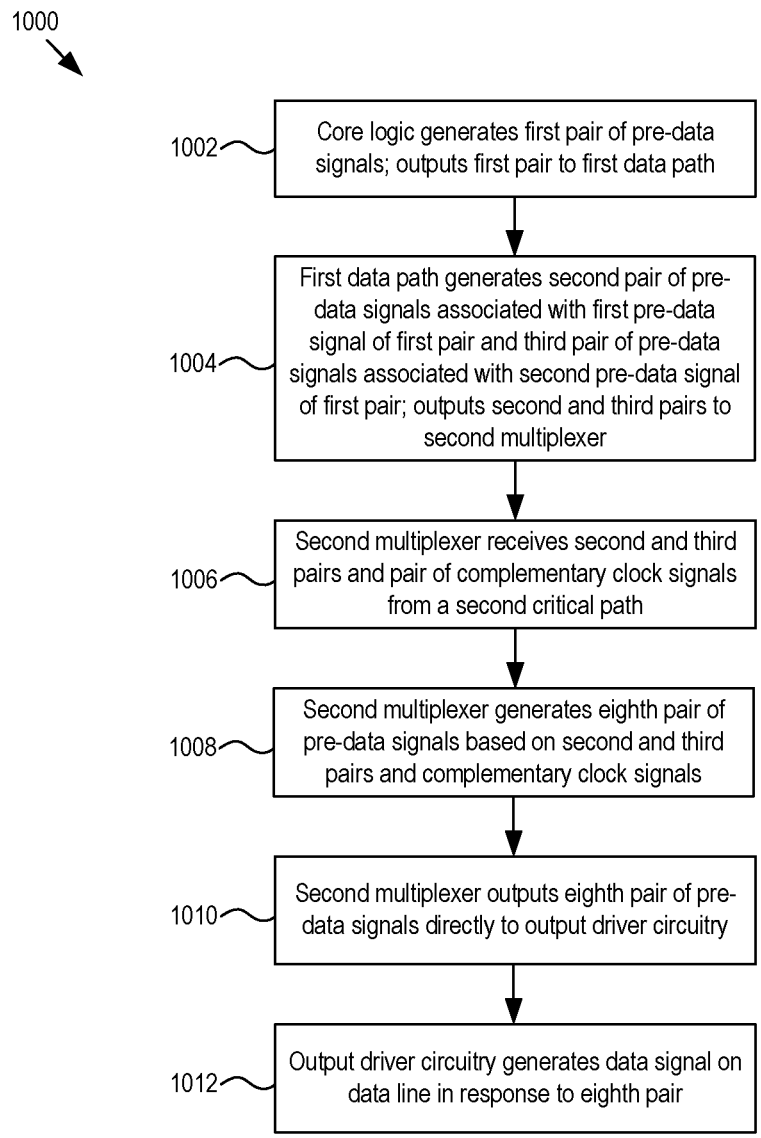
FIG. 10 shows a flow chart of another example method of a clock-receiving system generating a data signal for communication on a data line to a clock-sending system.

FIG. 10 shows a flow chart of another example method 1000 of a clock-receiving system generating a data signal for communication on a data line to a clock-sending system. At block 1002, core logic circuitry of the clock-receiving system may generate a first pair of pre-data signals including or carrying data that is to be sent to the clock-sending system. The core logic circuitry may generate the first pair of pre-data signals in a core voltage domain associated with a core voltage VDD. In some example methods, the core logic circuitry may generate the first pair of pre-data signals using a first clock signal generated with circuit components of a first critical path of the clock-receiving system. In addition, in some example methods, block 1002 may also include generating the first clock signal with the circuit components of the first critical path based on receipt of a host clock signal on a host clock line. For example, a Schmitt trigger, being powered with a reference voltage REF, may receive the host clock signal and in response, output a second clock signal to clock level shifter circuitry. The reference voltage REF may be set to a low operating voltage level of an IO voltage VDDO. The second clock signal may oscillate between the low operating voltage level and a low level (e.g., 0 V). The clock level shifter circuitry may generate a third clock signal that is a down-shifted version of the second clock signal. For example, the clock level shifter circuitry may generate the third clock signal by down shifting the second clock signal from the low operating voltage domain to the core voltage domain. The clock level shifter circuitry may output the third clock signal to first clock driver circuitry, which in turn may generate the first clock signal and output the first clock signal to the core logic circuitry.

The rate of the first clock signal may be two times faster than the rate of the first pair of pre-data signals. In addition, the first pair of pre-data signals may be phase-shifted relative to each other by 90-degrees with reference to their rate and 180-degrees with reference to the rate of the first clock signal. A first pre-data signal of the first pair of pre-data signals may lead a second pre-data signal of the first pair of pre-data signals. In addition, at block 1002, the core logic circuitry may output the first pair of pre-data signals to a first data path.

At block 1004, the first data path may receive the first pair of pre-data signals, and in response generate a second pair of pre-data signals associated with the first pre-data signal of the first pair and a third pair of pre-data signals associated with the second pre-data signal of the first pair. The pre-data signals of the second pair may be directly aligned with each other, and the pre-data signals of the third pair may be directly aligned with each other. Also, the second and third pairs may be phase-shifted relative to each other in the same way that the first and second data signals of the first pair are phase shifted relative to each other.

In some example methods, at block 1004, a first multiplexer may receive the first pair and in response generate a fourth pair of pre-data signals associated with the first data signal of the first pair and a fifth pair of pre-data signals associated with the second data signal of the first pair. Not only may the first multiplexer be used to convert the first pair of pre-data signals into the fourth and fifth pair, but it also may be used to toggle between the first data path and a second data path being activated. The example method 1000 may be used for when the clock-receiving system is operating in a low operating voltage mode associated with the low operating voltage level of the IO voltage VDDO. In alternative methods, when the clock-receiving system is operating in a high operating voltage mode associated with the IO voltage VDDO being at a high operating voltage level, the first multiplexer may activate the second data path instead of the first data path in order to generate pre-data signals for generation of the data signal on the data line.

The first multiplexer may output the fourth and fifth pairs of pre-data signals to level shifter circuitry, which in turn may up-shift the fourth and fifth pairs from the core voltage domain to the low operating voltage domain to generate sixth and seventh pairs of pre-data signals. The sixth pair of pre-data signals may be associated with the first pre-data signal of the first pair, and the seventh pair of pre-data signals may be associated with the second pre-data signal of the first pair. The level shifter circuitry may output the sixth and seventh pairs of pre-data signals to pre-driver circuitry, which in turn may generate the second and third pairs of pre-data signals. Also, at block 1004, the pre-driver circuitry may output the second and third pairs of pre-data signals to a second multiplexer.

At block 1006, the second multiplexer may receive the second and third pairs of pre-data signals as well as a pair of complementary clock signals generated with circuit components of a second critical path of the clock-receiving system. Like the first clock signal used to generate the first pair of pre-data signals, the rate of the complimentary signals may be twice the rate of the second and third pairs of pre-data signals. In addition, the relative rates and phase shifts of the pair of complementary clock signals and the second and third pairs of pre-data signals may be such that for each of a plurality of clock cycles of the clock signals, during a first half of the clock cycle where a first of the clock signals is high and a second of the clock signals is low, the leading second pair of pre-data signals may maintain a constant level while the lagging third pair of pre-data signals may transition their levels (i.e., perform rising transitions or falling transitions), and during a second half of the clock cycle where the first clock signal is low and the second is high, the lagging third pair of pre-data signals may maintain a constant level while the leading second pair of pre-data signals may transition their levels.

In addition, the core logic circuitry may and output the first pair of pre-data signals, and in turn the circuit components of the first data may generate and output the second and third pairs of pre-data signals such that initial cycles of the second and third pairs are received at a first inputs of the second multiplexer at least one half clock cycle of the complementary clock signals before initial cycles of the complementary clock signals are received at second inputs of the second multiplexer.

At block 1008, the second multiplexer may generate an eighth pair of pre-data signals based on receiving the complementary clock signals and the second and third pairs of pre-data signals. The pre-data signals of the eight pair may be directly aligned with each other. In addition, in some example methods, generating the eighth pair of pre-data signals with the second multiplexer at block 1008 may include: for each cycle of the complementary clock signals, during a first half cycle when the first clock signal is high and the second clock signal is low, setting a voltage on first and second outputs of the second multiplexer to a level that matches a voltage level of the second pair of pre-data signals, and during a second half cycle when the first clock signal is low and the second clock signal is high, setting the voltage on the first and second outputs of the second multiplexer to a level that matches a voltage level of the third pair of pre-data signals.

At block 1010, the second multiplexer may output the eighth pair of pre-data signals directly to an input of output driver circuitry. At block 1012, the output driver circuitry may generate the data signal on the data line in response to receiving the eighth pair of pre-data signals. In some example methods, to generate the data signal, the output driver circuitry may pull up the voltage to the low operating voltage level in response to the eighth pair of pre-data signals being at their respective low levels and may pull down the voltage to a low level (e.g., ground or 0 V) in response to the eighth pair of pre-data signals being at their respective high levels.

Figure 11:
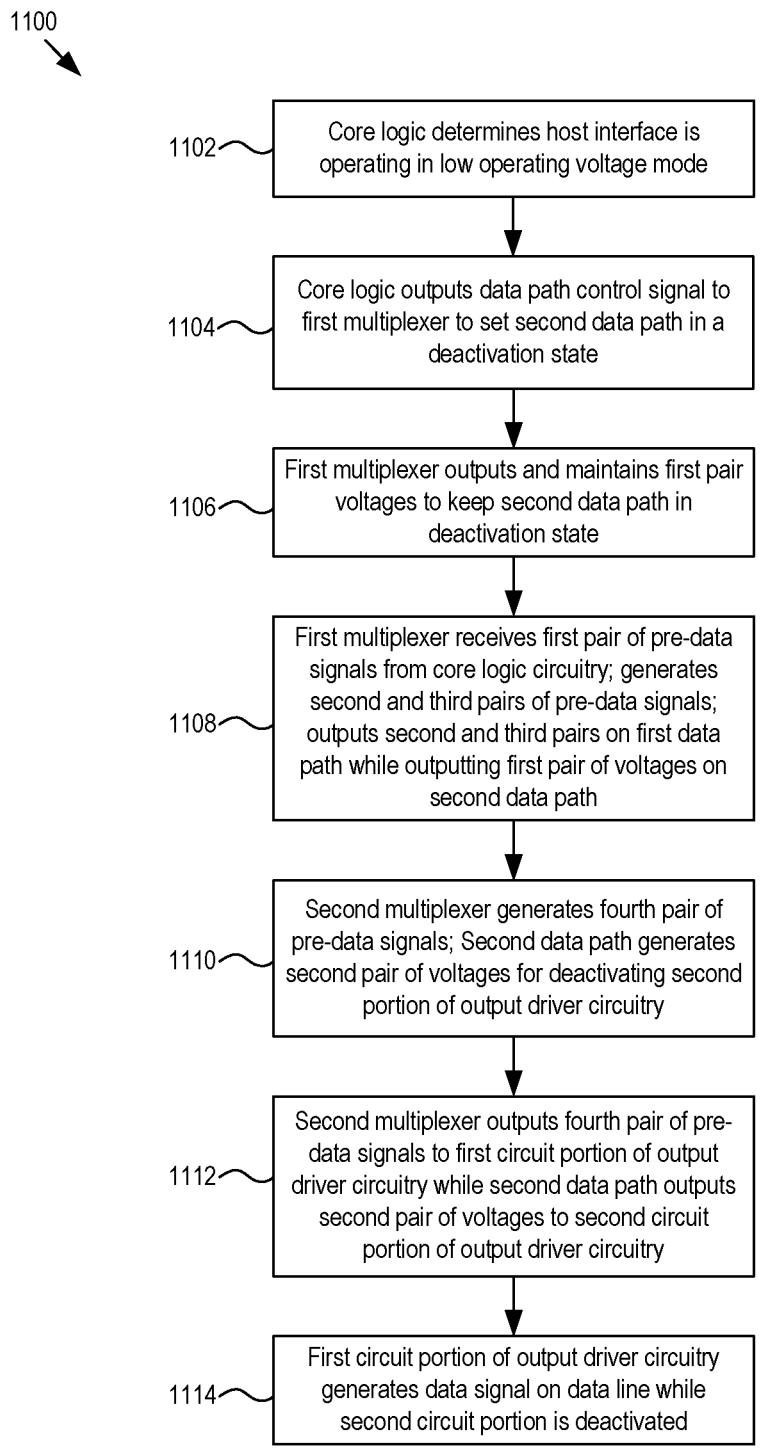
FIG. 11 shows a flow chart of another example method of a clock-receiving system generating a data signal for communication on a data line to a clock-sending system.

FIG. 11 shows a flow chart of another example method 1100 of a clock-receiving system generating a data signal for communication on a data line to a clock-sending system. At 1102, core logic circuitry of the clock-receiving system may determine that a host interface of the clock-receiving system is operating in a low operating voltage mode. At block 1104, in response to the determination, the core logic circuitry may output a data path control signal to a first multiplexer to cause the first multiplexer to set a second data path used to generate the data signal when the host interface is operating in a high operating voltage mode in a deactivation state. In the deactivation state, the second data path may deactivate a second circuit portion of output driver circuitry while a first circuit portion of the output driver circuitry generates the data signal on the communication line.

At block 1106, in response to receiving the data path control signal, the first multiplexer may output and maintain a first pair of voltages on the second data path that keeps the second data path in the deactivation state. In one example, a first voltage of the voltage pair may be at a core voltage level VDD and a second voltage of the voltage pair may be at a low level, such as 0 V.

At block 1108, the core logic circuitry may output, and the first multiplexer may receive from the core logic circuitry, a first pair of pre-data signals. The first pair of pre-data signals may include data to be sent to the clock-sending system. In addition, the first pair of pre-data signals may be generated by the core logic circuitry in a core voltage domain associated with the core voltage level VDD. Also, the pre-data signals of the first pair may be phase shifted relative to each other, as previously described. In response to receiving the first pair of pre-data signals, the first multiplexer may generate a second and third pair of pre-data signals, with the second pair being associated with a first pre-data signal of the first pair and the third pair being associated with a second pre-data signal of the first pair. In addition, the second and third pairs may each be generated in the core voltage domain. The first multiplexer may output the second and third pairs of pre-data signals on the first data path while outputting the first pair of voltages on the second data path to keep the second data path in the deactivation state.

At block 1110, a second multiplexer may generate a fourth pair of pre-data signals based on the second and third pairs of pre-data signals for generating the data signal with the first circuit portion of the output driver circuitry. In some example methods, in order to generate the fourth pair of pre-data signals, level shifter circuitry of the first data path may receive the second and third pair of pre-data signals from the first multiplexer and in response, generate and output fifth and sixth pairs of pre-data signals. The fifth pair of pre-data signal may be associated with the first pre-data signal of the first pair and the sixth pair of pre-data signals may be associated with the second pre-data signal of the first pair. In addition, the level shifter circuitry may generate the fifth and sixth pairs by converting the second and third pre-data signals in the core voltage domain to a low operating voltage domain. Pre-driver circuitry of the first data path may then receive the fifth and sixth pairs and generate seventh and eighth pairs of pre-driver signals based on the fifth and sixth pairs. The pre-driver circuitry may output the seventh and eighth pairs to the second multiplexer in order to generate the fourth pair of pre-data signals. The second multiplexer may also receive and use a pair of complementary clock signals generated on a second critical path in order to generate the fourth pair of data signals, as previously described.

In addition, at block 1110, circuit components of the second data path may generate a second pair of voltages for deactivating the second circuit portion of the output driver circuitry. The second pair of voltages may be generated in the low operating voltage domain. In some example methods, in order to generate the second pair of voltages, the first multiplexer may output the first pair of voltages to level shifter circuitry of the second data path, which in turn may generate a third pair of voltages in the low operating voltage domain, with one of the voltages of the third pair being at the low operating voltage level and the other of the third pair being at a low level such as 0 V. The level shifter circuitry of the second data path may output the third pair of voltages to pre-driver circuitry of the second path, which in turn may generate the second pair of voltages.

At block 1112, the second multiplexer may output the fourth pair of pre-data signals to the first circuit portion of the output driver circuitry while the second data path outputs the second pair of voltages to the second circuit portion of the output driver circuitry. At block 1114, the second circuit portion may be deactivated in response to the second pair of voltages received from the second data path while the first circuit portion pulls up and down the voltage the data line in response to the fourth pair of pre-data signals to generate the data signal.

Figure 12:
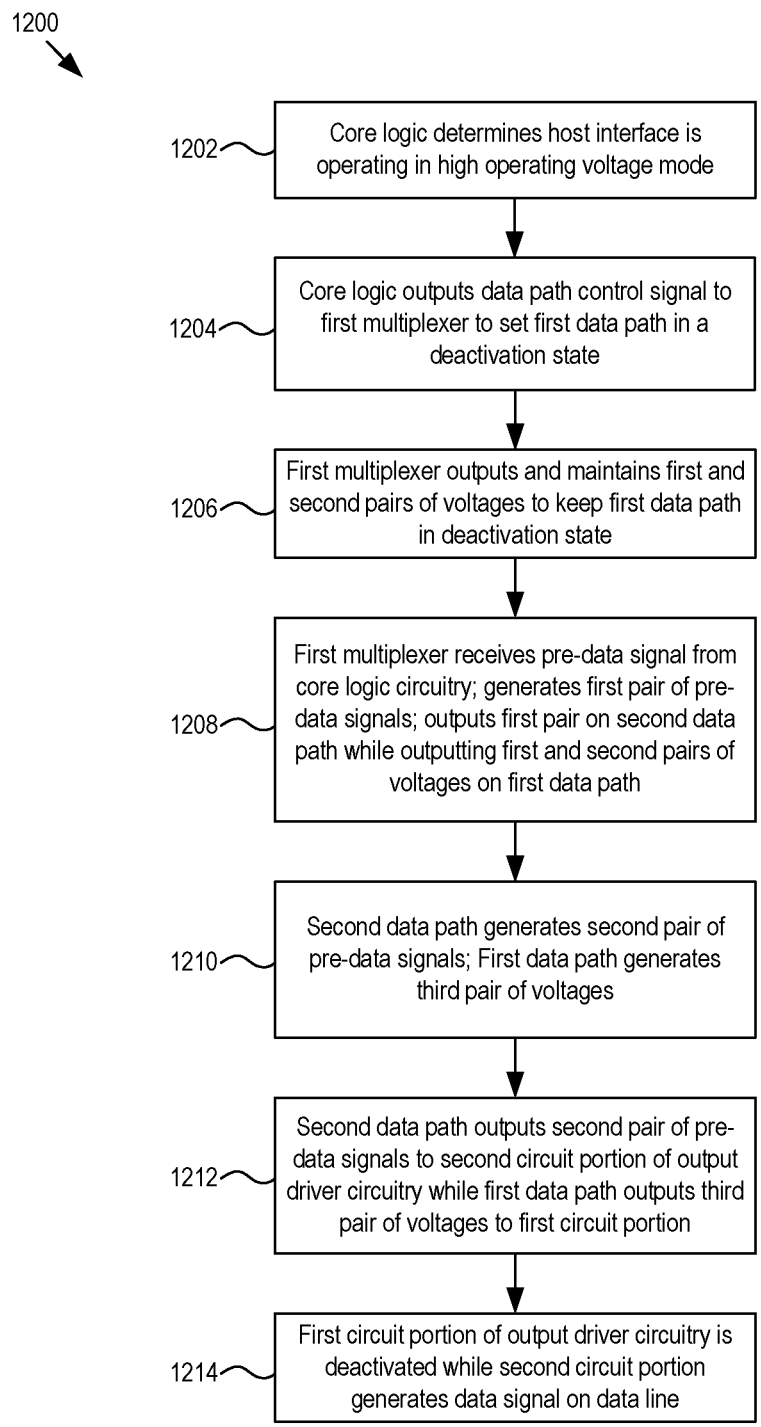
FIG. 12 shows a flow chart of another example method of a clock-receiving system generating a data signal for communication on a data line to a clock-sending system.

FIG. 12 shows a flow chart of another example method 1200 of a clock-receiving system generating a data signal for communication on a data line to a clock-sending system. At 1202, core logic circuitry of the clock-receiving system may determine that a host interface of the clock-receiving system is operating in a high operating voltage mode. At block 1204, in response to the determination, the core logic circuitry may output a data path control signal to a first multiplexer to cause the first multiplexer to set a first data path used to generate the data signal when the host interface is operating in a low operating voltage mode in a deactivation state. In the deactivation state, the first data path may deactivate a first circuit portion of output driver circuitry while a second circuit portion of the output driver circuitry generates the data signal on the communication line.

At block 1206, in response to receiving the data path control signal, the first multiplexer may output and maintain first and second pairs of voltages on the first data path that keeps the second data path in the deactivation state. In one example, a first voltage of each of the first and second voltage pairs may be at a core voltage level VDD and a second voltage of each of the first and second voltage pairs may be at a low level, such as 0 V.

At block 1208, the core logic circuitry may output, and the first multiplexer may receive from the core logic circuitry, a pre-data signal that includes data to be sent to the clock-sending system. In addition, the pre-data signal may be generated by the core logic circuitry in a core voltage domain associated with the core voltage level VDD. In response to receiving the pre-data signal, the first multiplexer may generate a first pair of pre-data signals. The first pair may be generated in the core voltage domain and be directly aligned with each other. The first multiplexer may output the first pair of pre-data signals on the second data path while outputting the two pairs of voltages on the first data path to keep the first data path in the deactivation state.

At block 1210, circuit components of the second data path may generate a second pair of pre-data signals in the high operating voltage domain based on the first pair of pre-data signals for generating the data signal with the second circuit portion of the output driver circuitry. In some example methods, in order to generate the second pair of pre-data signals, level shifter circuitry of the second data path may receive the first pair of pre-data signals from the first multiplexer and in response, generate and output a third pair of pre-data signals. The level shifter circuitry may generate the third pair by converting the first pair in the core voltage domain to the high operating voltage domain. Pre-driver circuitry of the second data path may then receive the third pair and generate the second pair based on the third pair.

In addition, at block 1210, circuit components of the first data path may generate a third pair of voltages for deactivating the first circuit portion of the output driver circuitry based on the first and second pairs of voltages. One of the voltages of the third pair may be generated at the high operating voltage level and the other voltage of the third pair may be generated at a low level such as 0 V. In some example methods, in order to generate the third pair of voltages, the first multiplexer may output the first and second pairs of voltages to level shifter circuitry of the first data path, which in turn may generate fourth and fifth pairs of voltages. One of the voltages of each of the fourth and fifth pairs may be generated at a reference voltage level, which may be less than the high operating voltage level (e.g., the reference voltage level may be the low operating voltage level), and the other voltage of each of the fourth and fifth pairs may be generated at a low level such as 0 V. The level shifter circuitry of the first data path may output the fourth and fifth pairs of voltages to pre-driver circuitry of the first path, which in turn may generate sixth and seventh pairs of voltages. One of the voltages of each of the sixth and seventh pairs may be generated at the high operating voltage level and the other voltage of each of the sixth and seventh pairs may be generated at a low level such as 0 V.

In some example methods, the pre-driver circuitry of the first data path may include a pair of pre-driver circuits, including a first pre-driver circuit and a second pre-driver circuit, that generates the voltages of the sixth and seventh pairs at the high operating voltage level. As previously described with respect to FIG. 8, each of the pre-driver circuits may include a first PMOS transistor that is supplied an IO voltage VDDO generated at the high operating voltage level and that pulls up a voltage generated on an output of a respective pre-driver circuit to the high operating voltage level. The voltages generated at the low levels (e.g. 0 V) of the fourth and fifth pairs may be applied to the gate voltages of the first PMOS transistors to turn on the first PMOS transistors, causing them to pull up the voltages at the outputs. Also, each of the pre-driver circuits may include a NMOS transistor with a drain terminal connected to the output of the respective pre-driver circuit, and a second PMOS transistor with a source terminal connected to a source terminal of the NMOS transistor. The drain terminals of the second PMOS transistors may be supplied with the reference voltage REF and gate terminals of the second PMOS transistors may receive the low level voltages of the fourth and fifth pairs. The second PMOS transistors may set a voltage on the source terminal of the NMOS transistors that yields a drain-to-source voltage across the NMOS transistors that is safely below their breakdown voltage levels while the first PMOS transistors are pulling up the voltages to the high operating voltage levels.

Also, to generate the third pair of voltages at block 1210, the pre-driver circuitry may output the sixth and seventh pairs to a second multiplexer, which may also receive an eighth pair of voltages as selection signals. One of the voltages of the eighth pair may be at the reference voltage level and the other voltage of the eighth pair may be at 0 V. In response to receiving the sixth, seventh, and eighth pairs of voltages, the second multiplexer may generate at its output the third pair of voltages. The second multiplexer may have the pass gate circuit configuration previously shown and described with reference to FIG. 6 to receive the sixth, seventh, and eighth pairs of voltages and generate the third pair of voltages.

At block 1212, the second data path may output the second pair of pre-data signals to the second circuit portion of the output driver circuitry for generating the data signal on the data line while the second multiplexer outputs the third pair of voltages to the first circuit portion of the output driver circuitry. At block 1214, the first circuit portion may be deactivated in response to the third pair of voltages received from the first data path while the second circuit portion pulls up and down the voltage on the data line in response to the second pair of pre-data signals to generate the data signal.

In other example methods, less than all of the actions identified in the flow charts of FIGS. 9-12 may be performed to generate a data signal for communication on a data line. Still other example methods may combine at least some of the actions performed in two or more of the different methods of FIGS. 9-12 to generate a data signal. Various ways of generating a data signal on a data line using the actions described in the flow charts with reference to FIGS. 9-12 may be possible.

Figure 13:
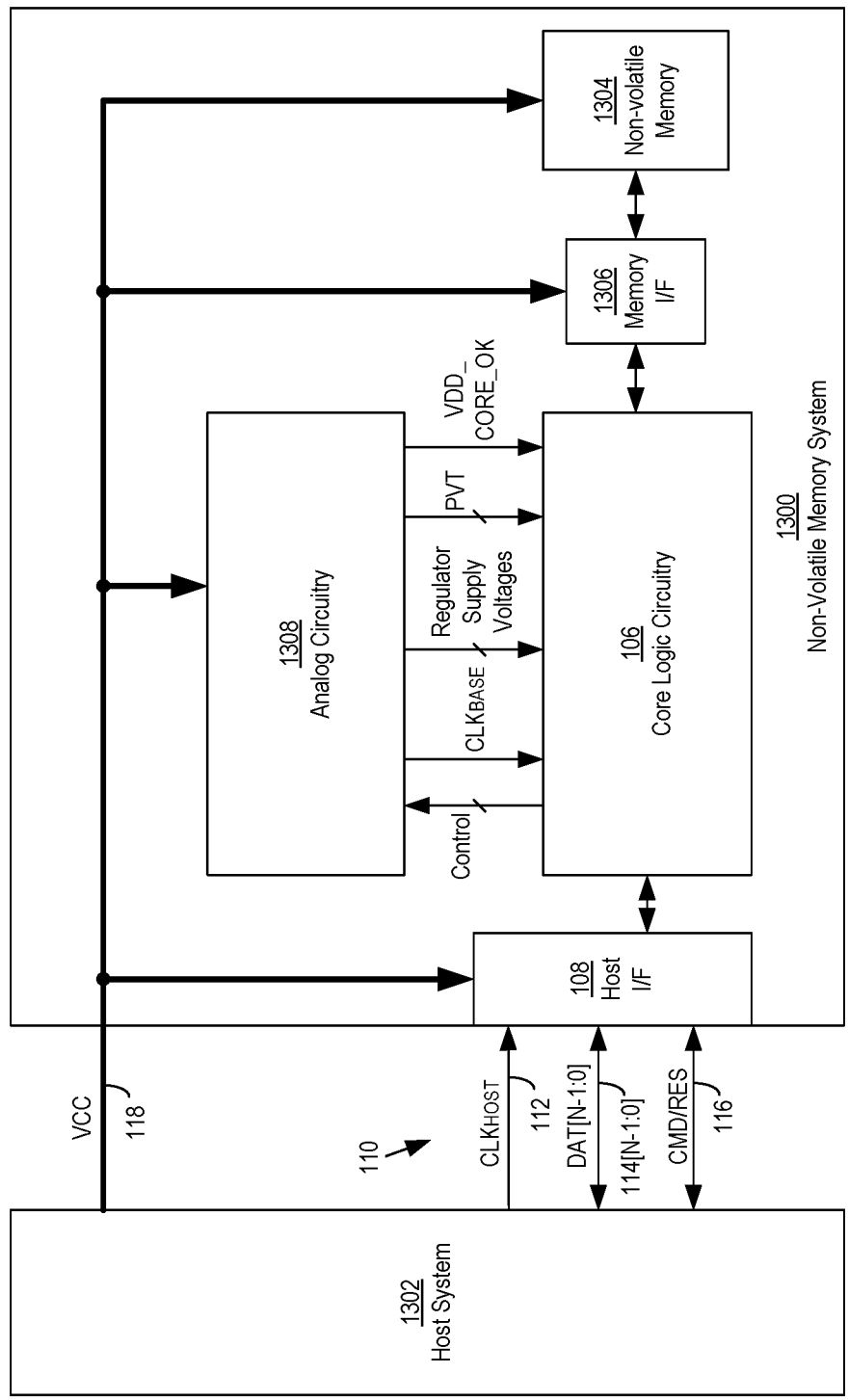
FIG. 13 is a block diagram of a self-synchronous memory system that may implement the circuit components of FIGS. 2-8 and/or perform the methods described with reference to FIGS. 9-12.

FIG. 13 shows a block diagram of an example implementation of the clock-receiving system 102 and the clock-receiving system 104 of FIG. 1 that may use or include the circuit components shown and described with reference to FIGS. 2-8 and/or perform the methods described with reference to FIGS. 9-12. The clock-receiving system 102 may be a host system 1302 and the clock-receiving system 104 may be non-volatile memory system 1300. The non-volatile memory system 1300 that may include two critical paths for two operating voltages. In one embodiment, the memory system 1300 may be a card based system, such as a secure digital (SD) or a micro secure digital (micro-SD) card. In an alternate embodiment, the non-volatile memory system 1300 may be part of an embedded memory system. The host system 1302 may be any electronic system or device that is configured to communicate and/or operate with the non-volatile memory system 1300.

As shown in FIG. 13, the non-volatile memory system 1300 may include the core logic circuitry 106 and the host interface 108, which may include the circuit components and operate as described above with reference to FIG. 1. In addition, the host-system 1302 and the non-volatile memory system 1300 may be configured to communicate with each other via the communication bus 110, which may include the clock line 112, the N-number of data lines 114, and the command line 116. Also, the host system 1302 may supply a supply voltage VCC on a supply line 118 to the non-volatile memory system 1300 to power components of the non-volatile memory system 1300.

In addition the core logic circuitry 106 and the host interface 108, the non-volatile memory system 1300 may include non-volatile memory 1304, which may include a plurality of non-volatile memory elements or cells, each configured to store one or more bits of data. The non-volatile memory elements or cells may be any suitable non-volatile memory cells, such as NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable.

In addition to the operations previously described, the core logic circuitry 106 may also be configured to perform memory management functions for the storage of data in the non-volatile memory 104. Example memory management functions may include, but not limited to, communicating with the host system 102, including receiving, handling, and responding to host requests or commands, such as read, write, erase, and status requests/commands received from the host system 1302; formatting the non-volatile memory 1304 to ensure it is operating properly; mapping out bad memory cells; allocating spare cells to be substituted for future failed cells; and transitioning the non-volatile memory system 1300 between different states, operation modes, and/or power consumption modes. In operation, when the host system 102 needs to read data from or write data to the non-volatile memory 104, it may communicate with the core logic circuitry 106.

The non-volatile memory system 1300 may also include a memory interface (I/F) 1306 that provides an interface between the core logic circuitry 106 and the non-volatile memory 1304. The core logic circuitry 106 may be configured to communicate data and commands with the non-volatile memory 1304 via the memory interface 1306 to store data in and/or read data from the non-volatile memory 1304.

The non-volatile memory system 100 may also include analog circuitry 1308 that provides a plurality of regulator supply voltages to the core logic circuitry 106, including a core supply voltage VDD. In addition, the analog circuitry 108 may provide a base clock signal $CLK_{BASE}$, one or more process-voltage-temperature (PVT) signals, and a core voltage stabilization signal VDD_CORE_OK indicating whether the core supply voltage is at a stable level. The core logic circuitry 106 may send one or more control signals to the analog circuitry 1308 to configure, program, enable, and/or disable various components of the analog circuitry 1308.

When the host system 1302 sends a read request to request that the non-volatile memory system 1300 perform a read operation to read requested data stored in the non-volatile memory 1304, the core logic circuitry 106 may communicate with the non-volatile memory 1304 via the memory interface 1306 to retrieve the requested data. When the requested data is retrieved, the core logic circuitry 106 may provide the data to the host interface 108, which in turn may send the data as data signals DAT[N−1:0] to the host system 102 on the N-number of data lines 114[N−1:0].

The non-volatile memory system 1300 may use the host clock signal $CLK_{HOST}$ received on the clock line 112 to generate the data signals DAT[N−1:0] that are sent back to the host system 102 to execute the read operation. In particular, the circuit components of the host interface 108 and/or the core logic circuitry 106 previously described with reference to FIGS. 2-8 may receive the host clock signal $CLK_{HOST}$, or at least a buffered version of the host clock signal $CLK_{HOST}$, and pull up and down the levels of the data signals DAT[N−1:0] according to the rate of the host clock signal (i.e., according to the rising and/or falling edge occurrences of the host clock signal) in order to transfer the requested data back to the host system 1302 for execution of the host read request.

Similar configurations may be implemented and/or similar methods may be performed in electronic systems, devices, or apparatuses utilizing self-synchronous clock-sending and clock-receiving systems other than non-volatile memory systems.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

I claim:

1. A system comprising:
   output driver circuitry configured to generate an output data signal for communication on a data line of a communications bus, the output driver circuitry comprising:

a first circuit portion configured to generate the output data signal in a high operating voltage mode;
a second circuit portion configured to generate the output data signal in a low operating voltage mode; and
a multiplexer circuit configured to:
output and maintain a first set of voltages at a first set of levels to deactivate the second circuit portion in the high operating voltage mode; and
output and maintain a second set of voltages at a second set of levels to deactivate the first circuit portion in the low operating voltage mode.

2. The system of claim 1, further comprising:
core logic circuitry configured to control whether the multiplexer circuit is configured to output the first set of voltages in the high operating voltage mode or the second set of voltages in the low operating voltage mode.

3. The system of claim 2, wherein the core logic circuitry is further configured to:
in the high operating voltage mode, output a core output data signal to the multiplexer for generation of the output data signal; and
in the low operating voltage mode, output a pair of phase shifted core output data signals to the multiplexer for generation of the output data signal.

4. The system of claim 3, wherein the multiplexer is configured to:
in the high operating voltage mode, output, to first data path circuitry, a first pair of multiplexer output data signals for generation of the output data signal in response to receipt of the core output data signal; and
in the low operating voltage mode, output, to second data path circuitry, a second pair of multiplexer output data signals and a third pair of multiplexer output data signals, wherein the second pair is associated with a first data signal of the pair of phase shifted core output data signals and the third pair is associated with a second data signal of the pair of phase shifted core output data signals.

5. The system of claim 4, wherein:
in the high operating voltage mode:
the first data path circuitry is configured to generate a first pair of data path output data signals based on the first pair of multiplexer output data signals; and
output the first pair of data path output data signals to the first circuit portion of the output driver circuitry for generation of the data signal; and
the second data path circuitry is configured to generate a third set of voltages at a third set of levels to the second circuit portion of the output driver circuitry for deactivation of the second circuit portion; and
in the low operating voltage mode:
the second data path circuitry is configured to generate a second pair of data path output data signals based on the second and third pairs of multiplexer output data signals; and output the second pair of data path output signals to the second circuit portion of the output driver circuitry for generation of the data signal; and
the first data path circuitry is configured to generate a fourth set of voltages at a fourth set of voltage levels to the first circuit portion of the output driver circuitry for deactivation of the first circuit portion.

6. The system of claim 4, wherein the second data path circuitry comprises a pre-driver circuit comprising:
an output node;
first transistor circuitry connected to the output node and configured to be supplied with an input/output (I/O) voltage and pull up a voltage at the output node to a level of the I/O voltage;
second transistor circuitry connected to the output node and configured to pull down the voltage at the output node to ground; and
third transistor circuitry connected to an internal node of the second transistor circuitry and configured to be supplied with a reference voltage, wherein a level of the reference voltage is lower than a level of the I/O voltage in the high operating voltage mode.

7. The system of claim 6, wherein the second data path circuitry further comprises level shifter circuitry configured to generate first and second pairs of level shifter output data signals based on the second and third pairs of multiplexer output data signals,
wherein each of the first circuitry, the second circuitry, and the third circuitry of the pre-driver circuitry comprises a data signal input connected to a same output of the level shifter circuitry.

8. A circuit comprising:
a first data path circuit configured to:
output a first pair of data signals in a high operating voltage mode; and
output and maintain a first set of voltages in a low operating voltage mode;
a second data path circuit configured to:
output a second pair of data signals in the low operating voltage mode; and
output and maintain a second set of voltages in a high operating voltage mode;
a first output driver circuit portion configured to:
generate an output data signal in response to the first pair of data signals in the high operating voltage mode; and
deactivate in response to the first set of voltages in the low operating voltage mode; and
a second output driver circuit portion configured to:
generate the output data signal in response to the second pair of data signals in the low operating voltage mode; and
deactivate in response to the second set of voltages in the high operating voltage mode.

9. The circuit of claim 8, further comprising:
a multiplexer circuit configured:
output a first pair of multiplexer output signals to the first data path circuit in the high operating voltage mode; and
output a second pair and a third pair of multiplexer output signals to the second data path circuit in the low operating voltage mode.

10. The circuit of claim 9, further comprising:
core logic circuitry configured to control the multiplexer circuit to output the first pair of multiplexer output signals to the first data path circuit in the high operating voltage mode, and to output the second and third pairs of multiplexer output signals to the second data path circuit in the low operating voltage mode.

11. The circuit of claim 10, wherein the core logic circuitry is further configured to:
output a core output signal to the multiplexer circuit to cause the multiplexer circuit to generate the first pair of multiplexer output signals to the first data path circuit; and output a pair of phase-shifted core output signals to the multiplexer circuit to cause the multiplexer circuit to generate the second and third pairs of multiplexer output signals.

12. The circuit of claim 8, wherein the second data path circuit comprises a pre-driver circuit comprising:
an output node;
first transistor circuitry connected to the output node, the first transistor circuitry configured to:
receive an input/output (I/O) voltage; and
pull up a voltage at the output node to a level of the I/O voltage;
second transistor circuitry connected to the output node, the second transistor circuitry configured to pull down the voltage at the output node to ground; and
third transistor circuitry connected to an internal node of the second transistor circuitry, the third transistor circuitry configured to receive a reference voltage, wherein a level of the reference voltage is lower than a level of the I/O voltage when the first output driver circuit portion is generating the output data signal in the high operating voltage mode.

13. The circuit of claim 12, wherein the second data path circuit further comprises level shifter circuitry configured to generate first and second pairs of level shifter output signals based on the second and third pairs of multiplexer output signals,
wherein each of the first transistor circuitry, the second transistor circuitry, and the third transistor circuitry of the pre-driver circuit comprises a signal input connected to a same output of the level shifter circuitry.

14. A circuit comprising:
means for generating an output data signal in a high operating voltage mode;
means for generating the output data signal in a low operating voltage mode; and
outputting and maintaining means for:
outputting and maintaining a first set of voltages at a first set of levels to deactivate the means for generating the output data signal in the low operating voltage mode when the means for generating the output data signal in the high operating voltage mode outputs the output signal in the high operating voltage mode; and
outputting and maintaining a second set of voltages at a second set of levels to deactivate the means for generating the output data signal in the high operating voltage mode when the means for generating the output data signal in the low operating voltage mode outputs the output signal in the low operating voltage mode.

15. The circuit of claim 14, further comprising:
means for controlling the outputting and maintaining means to output and maintain the first set of voltages or the second set of voltages.

16. The circuit of claim 15, further comprising:
means for outputting a core output signal to the outputting and maintaining means for generating the output data signal in the high operating voltage mode; and
means for outputting a pair of phase-shifted core output signals to the outputting and maintaining means for generating the output signal in the low operating voltage mode.

17. The circuit of claim 16, further comprising:
means for outputting a first pair of signals for generating the output data signal in the high operating voltage mode in response to receipt of the core output signal; and
means for outputting a second pair of signals and a third pair of signals for generating the output data signal in the low operating voltage mode in response to receipt of the pair of phase-shifted core output signals.

18. The circuit of claim 17, further comprising:
to generate the output signal in the high operating voltage mode:
means for outputting, to the means for generating the output signal in the high operating voltage mode, a fourth pair of signals based on the first pair of signals; and
means for outputting, to the means for generating the output signal in the low operating voltage mode, a third set of voltages at a third set of levels to the means for generating the output signal in the low operating voltage mode; and
to generate the output signal in the low operating voltage mode:
means for outputting, to the means for generating the output signal in the low operating voltage mode, a fifth pair of signals based on the second and third pairs of signals; and
means for outputting, to the means for generating the output signal in the high operating voltage mode, a fourth set of voltages at a fourth set of levels to the means for generating the output signal in the high operating voltage mode.

19. The circuit of claim 14, further comprising:
an output node;
means for pulling up a voltage at the output node to a level of an input/output (I/O) voltage;
means for pulling down the voltage at the output node to ground; and
means for receiving a reference voltage, wherein a level of the reference voltage is lower than a level of the I/O voltage when the means for generating the output data signal in the high operating voltage mode is generating the output data signal in the high operating voltage mode.

* * * * *